(12) United States Patent
Mimura

(10) Patent No.: US 7,860,600 B2
(45) Date of Patent: Dec. 28, 2010

(54) METHOD OF DETERMINING PICKUP ORDER OF COMPONENTS

(75) Inventor: Yoshihiro Mimura, Osaka (JP)

(73) Assignee: Panasonic Corporation, Osaka (JP)

( * ) Notice: Subject to any disclaimer, the term of this patent is extended or adjusted under 35 U.S.C. 154(b) by 268 days.

(21) Appl. No.: 12/162,925

(22) PCT Filed: Jan. 30, 2007

(86) PCT No.: PCT/JP2007/051862

§ 371 (c)(1),
(2), (4) Date: Jul. 31, 2008

(87) PCT Pub. No.: WO2007/091498

PCT Pub. Date: Aug. 16, 2007

(65) Prior Publication Data

US 2009/0024242 A1 Jan. 22, 2009

(30) Foreign Application Priority Data

Feb. 9, 2006 (JP) ............................. 2006-033066

(51) Int. Cl.
*G06F 19/00* (2006.01)
(52) U.S. Cl. .................. 700/121; 700/96; 700/100; 700/101; 29/740
(58) Field of Classification Search ................. 700/101, 700/121, 96, 100; 438/15, 106; 361/760, 361/761, 807; 29/832, 740
See application file for complete search history.

(56) References Cited

U.S. PATENT DOCUMENTS 5,084,962 A * 2/1992 Takahashi et al. ............. 29/833
5,383,270 A * 1/1995 Iwatsuka et al. ............. 29/840
5,933,351 A 8/1999 Balamurugan (Continued)

FOREIGN PATENT DOCUMENTS

JP 2005-72444 3/2005

(Continued)

OTHER PUBLICATIONS

International Search Report issued Jun. 4, 2007 in the International (PCT) Application of which the present application is the U.S. National Stage.

*Primary Examiner*—Albert DeCady
*Assistant Examiner*—Dave Robertson
(74) *Attorney, Agent, or Firm*—Wenderoth, Lind & Ponack, L.L.P.

(57) ABSTRACT

To provide a method for determining a component pickup order used by a component mounting apparatus which has plural mounting heads, and which causes the mounting heads to alternately pick up components from a component supplying unit and mount the components onto boards. The component pickup order determining method includes pickup order determining steps (S2 and S4) of determining an order according to which the plural mounting heads pick up components from the component supplying unit, so that some of the components corresponding to two or more tasks do not remain in any one of restricted areas where one of the mounting heads cannot pick up any components, when the component supplying unit includes the restricted areas and a task is referred to as at least one of components which is mounted in one of repeatedly executed operation sequences each of which includes suctioning, moving and mounting of the components executed by the mounting heads.

10 Claims, 20 Drawing Sheets

U.S. PATENT DOCUMENTS

| | | | |
|---|---|---|---|
| 6,176,011 B1 * | 1/2001 | Shirakawa | 29/832 |
| 6,295,728 B1 * | 10/2001 | Shin et al. | 29/840 |
| 6,584,683 B2 * | 7/2003 | Yoshida et al. | 29/834 |
| 6,729,018 B1 * | 5/2004 | Takano et al. | 29/743 |
| 6,739,043 B2 * | 5/2004 | Shirakawa | 29/834 |
| 6,792,674 B2 * | 9/2004 | Yoshii et al. | 29/740 |
| 6,868,603 B2 * | 3/2005 | Okuda et al. | 29/832 |
| 7,089,656 B2 * | 8/2006 | Nagao et al. | 29/740 |
| 7,222,414 B2 * | 5/2007 | Gamel et al. | 29/740 |
| 7,415,759 B2 * | 8/2008 | Vischer | 29/740 |
| 7,536,236 B2 * | 5/2009 | Yano et al. | 700/121 |
| 7,591,068 B2 * | 9/2009 | Kawazoe et al. | 29/832 |
| 7,603,193 B2 * | 10/2009 | Maenishi et al. | 700/100 |
| 2002/0189090 A1 * | 12/2002 | Shirakawa | 29/834 |
| 2004/0168310 A1 * | 9/2004 | Takano et al. | 29/832 |
| 2007/0101572 A1 | 5/2007 | Kabeshita et al. | |
| 2009/0259333 A1 * | 10/2009 | Yano et al. | 700/121 |

FOREIGN PATENT DOCUMENTS

| | | |
|---|---|---|
| WO | 2005/022607 | 3/2005 |
| WO | 2005/032233 | 4/2005 |

* cited by examiner

METHOD OF DETERMINING PICKUP ORDER OF COMPONENTS

TECHNICAL FIELD

The present invention relates to a method of determining a pickup order of components, and in particular to a method of determining a pickup order of components in the case of picking up components that are semiconductor chips from a diced wafer and mounting them onto boards.

BACKGROUND ART

Conventionally, there have been proposed component mounting apparatuses which have two mounting stages each having a mounting head in order to execute manufacturing with a high efficiency (for example, refer to Japanese Laid-open patent publication No. 2005-72444).

The component mounting apparatus mounts components onto boards by causing the two mounting heads to alternately pick up the components that are semiconductor chips from a diced wafer. In this way, the component mounting apparatus disclosed in Japanese Laid-open patent publication No. 2005-72444 mounts the components onto the boards by causing the two mounting heads to pick up the components from the wafer in cooperation with each other. This makes it possible to downsize component mounting apparatuses, and increase space productivity. Furthermore, this makes it possible to improve the workability of supplying wafers.

However, wafers having a diameter of 8 inches are being replaced by wafers having a diameter of 12 inches in these days. On the other hand, the movable range for a mounting head is limited. Hence, in the case of using a wafer having an increased diameter, an area where a mounting head cannot suction any component (hereinafter referred to as "suction-restricted area") is generated in the wafer. Hence, such a suction-restricted area may remain in the end depending on an order of suctioning components. A suction-restricted area is referred to as an area where one of the mounting heads cannot suction any component while the other mounting head can suction components. In this case, the remaining components are mounted onto boards by using only one of the mounting heads and by pausing the other mounting head. This disables the mounting heads to mount components in cooperation with each other, which results in a problem of a poor efficiency in manufacturing boards on which components are mounted.

DISCLOSURE OF INVENTION

The present invention has been conceived in order to solve the above-described problem. The present invention aims to provide a method for determining an order of picking up components, which realizes an excellent efficiency in manufacturing boards. The method is intended for a component mounting apparatus which has plural mounting heads for picking up components from the component supplying unit and mounting the components onto boards.

In order to achieve the above object, the component pickup order determining method according to the present invention is for a component mounting apparatus which causes a plurality of mounting heads to pick up components from a component supplying unit while sliding the component supplying unit and to mount the components onto boards. The component supplying unit includes at least one restricted area where only one of the mounting heads can pick up components. The component pickup order determining method includes a component pickup order determining step of determining a component pickup order according to which the plurality of mounting heads pick up components from the component supplying unit so that components corresponding to two or more tasks do not remain in only a restricted area among at least one restricted area. The task is at least one component which is mounted by one of the mounting heads in one iteration of a sequence of operations which are suctioning, moving and mounting of a component.

This method eliminates the possibility that the same mounting head picks up components two or more times in sequence since components corresponding to two or more tasks do not remain in one of the restricted areas. Thus, when mounting components onto boards in this way, the possibility that only one of the mounting heads is used and the other mounting head is paused is eliminated. Therefore, it is always possible to cause the mounting heads to mount components in cooperation with each other; that is, it is possible to provide a method for determining an order of picking up components realizing an excellent efficiency in manufacturing boards.

The mounting heads in the present invention correspond to a first head unit and a second head unit in the embodiments to be described later on, and the component supplying unit corresponds to a component mounting apparatus.

The present invention can be realized not only as a component pickup order determining method having the unique steps, but also as a component pickup order determining apparatus having units corresponding to the unique steps included in the component pickup order determining method and a program causing a computer to execute the unique steps included in the component pickup order determining method. Such a program can be distributed through a recording medium such as compact Disc-Read Only Memory (CD-ROMs) and a communication network such as the Internet.

According to the present invention, it becomes possible to provide a method for determining an order of picking up components, which realizes an excellent efficiency in manufacturing boards. The method is intended for a component mounting apparatus which has plural mounting heads for picking up components from the component supplying unit (more specifically, a diced wafer, a tray on which components are arrayed, a component cassette housing components or the like) and mounting the components onto boards.

FURTHER INFORMATION ABOUT TECHNICAL BACKGROUND TO THIS APPLICATION

The disclosure of Japanese Patent Application No. 2006-33066 filed on Feb. 9, 2006 including specification, drawings and claims is incorporated herein by reference in its entirety.

BRIEF DESCRIPTION OF DRAWINGS

These and other objects, advantages and features of the invention will become apparent from the following description thereof taken in conjunction with the accompanying drawings that illustrate a specific embodiment of the invention. In the Drawings:

FIG. 4(A) shows a state where a wafer is not expanded, and FIG. 4(B) shows a state where the wafer is expanded;

BEST MODE FOR CARRYING OUT THE INVENTION

Embodiments according to the present invention will be described below with reference to the drawings.

First Embodiment

Figure 1:
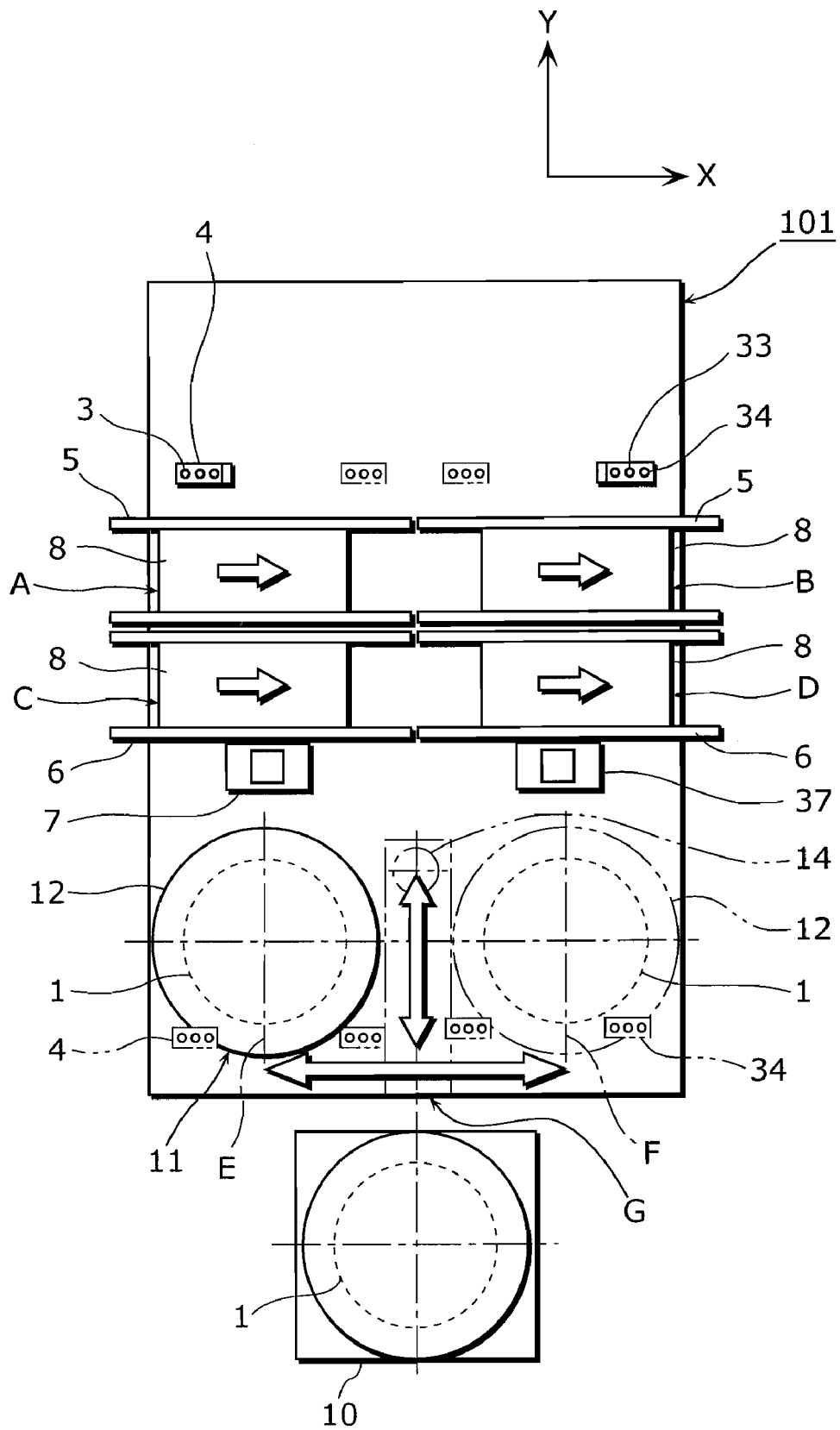
FIG. 1 is a schematic plan view of a component mounting apparatus according to a first embodiment of the present invention.

FIG. 1 is a diagram showing a schematic structure of a component mounting apparatus according to a first embodiment of the present invention.

As shown in FIG. 1, the component mounting apparatus 101 is intended for mounting semiconductor chips onto circuit boards. The semiconductor chips are an example of components to be supplied from a diced wafer, and the circuit boards are an example of boards. In addition, the component mounting apparatus 101 includes a board carrying device which carries a circuit board 8 to be supplied and releasably holds the circuit board 8 to be supplied at a board holding position which is a predetermined position in the direction of carriage. As shown in FIG. 1, this board carrying device has two adjacent sets of a pair of carrier rails 5 and carrier rails 6. The carrier rails are for carrying the circuit board 8, which is supplied from the left side of the component mounting apparatus 101 in this figure, in the rightward direction in the figure by supporting the circuit board 8 on the edges. Note that the left to right direction in FIG. 1 is the X-axis direction and the direction orthogonal to the X-axis direction is the Y-axis direction. The respective sets of carrier rails 5 and carrier rails 6 are positioned along the X-axis direction. In addition, the two sets of carrier rails 5 and 6 have two board holding positions. The position left to the carrier rails 5 in the figure is referred to as a first board holding position A, and the position right to them is referred to as a second board holding position B. The position left to the carrier rails 6 in the figure is referred to as a third board holding position C, and the position right to them is referred to as a fourth board holding position D. Since the board holding devices are structured in this manner, the component mounting apparatus 101 can mount components by simultaneously holding four circuit boards 8 in total. Note that the carrier rails 5 and 6 are examples of the board holding devices in this embodiment.

In addition, as shown in FIG. 1, the component mounting apparatus 101 includes: a first head unit 4 which is an example of a first mounting head mounting components onto circuit boards 8 held at the first board holding position A and the third board holding position C; and a second head unit 34 which is an example of a second mounting head mounting components onto circuit boards 8 held at the second board holding position B and the fourth board holding position D. In addition, the first head unit 4 and the second head unit 34 have suction nozzles 3 and suction nozzles 33. The respective suction nozzles 3 and 33 are examples of component holding members which are capable of releasably suctioning and holding semiconductor chips. The numbers of the suction nozzles 3 and 33 are, for example, three.

In addition, the component mounting apparatus 101 in the figure has a component supplying device 11 on the lower side in the figure. The component supplying device 11 has a holding table 12 which is an example of a wafer holding table holding a wafer 1 in a manner that it can supply the respective semiconductor chips. The component supplying device 11 can reciprocally move the holding table 12 between a first component supplying position E positioned around the left side edge in the base of the component mounting apparatus 101 and a second component supplying position F positioned around the right side edge which are along the X-axis direction in the figure. In addition, a wafer recognition position G which is an example of the component recognition position is positioned in between the first component supplying position E and the second component supplying position F, and a wafer camera 14 is provided above the wafer recognizing position G. The wafer camera 14 is an example of a component recognizing device which is capable of recognizing the positions of the respective semiconductor chips in the wafer 1 by capturing images of the semiconductor chips in the wafer 1 positioned at this wafer recognizing position G. Note that the wafer camera 14 is capable of moving forwardly and backwardly along the Y-axis direction in the figure. In addition, it is assumed here that the diameter of the wafer is, for example, 8 inches.

Further, as shown in FIG. 1, a wafer magazine 10 which houses plural wafers in a manner that it can supply the wafers to the component supplying device 11 is provided in the front side of the base of the component mounting apparatus 101. The wafer magazine 10 can supply each of the housed wafers 1 to the holding table 12 positioned at the wafer recognizing position G.

In addition, as shown in FIG. 1, the first head unit 4 can be moved reciprocally between the first board holding position A, the third board holding position C, and the first component supplying position E, and can be moved in the X-axis direction which is approximately along the surface direction of the circuit board 8 and the Y-axis direction in the figure. A not-shown first head moving device (for example, a first X-Y robot) which moves the first head unit 4 is provided. Likewise, the second head unit 34 can be moved reciprocally between the second board holding position B, the fourth board holding position D, and the second component supplying position F, and can be moved in the X-axis direction which is approximately along the surface direction of the circuit board 8 and the Y-axis direction in the figure. A not-shown second head moving device (for example, a second X-Y robot) which moves the second head unit 34 is provided.

In addition, as shown in FIG. 1, the movable range of the first head unit 4 controlled by the first X-Y robot is determined so that one of the suction nozzles 3 of the first head unit 4 can be positioned above an arbitrary position in the wafer 1 positioned at the first component supplying position E and above an arbitrary position of the circuit board 8 held at the first board holding position A and the third board holding position C. Likewise, the movable range of the second head unit 34 controlled by the second X-Y robot is determined so that one of the suction nozzles 33 of the second head unit 34 can be positioned above an arbitrary position in the wafer 1 positioned at the second component supplying position F and above an arbitrary position of the circuit board 8 held at the second board holding position B and the fourth board holding position D.

Further, a first component recognizing camera 7 is provided on the base between the first component supplying position E and the third component supplying position C. The first component recognizing camera 7 is capable of recognizing the attitudes of the semiconductor chips at the time of being suctioned and held by the respective suction nozzles 3 of the first head unit 4 by capturing images of the semiconductor chips in the suctioning and holding. Likewise, a second component recognizing camera 37 is provided on the base between the second component supplying position F and the fourth component supplying position D. The second component recognizing camera 37 is capable of recognizing the attitudes of the semiconductor chips at the time of being suctioned and held by the respective suction nozzles 33 of the second head unit 34 by capturing images of the semiconductor chips in the suctioning and holding.

Figure 2:
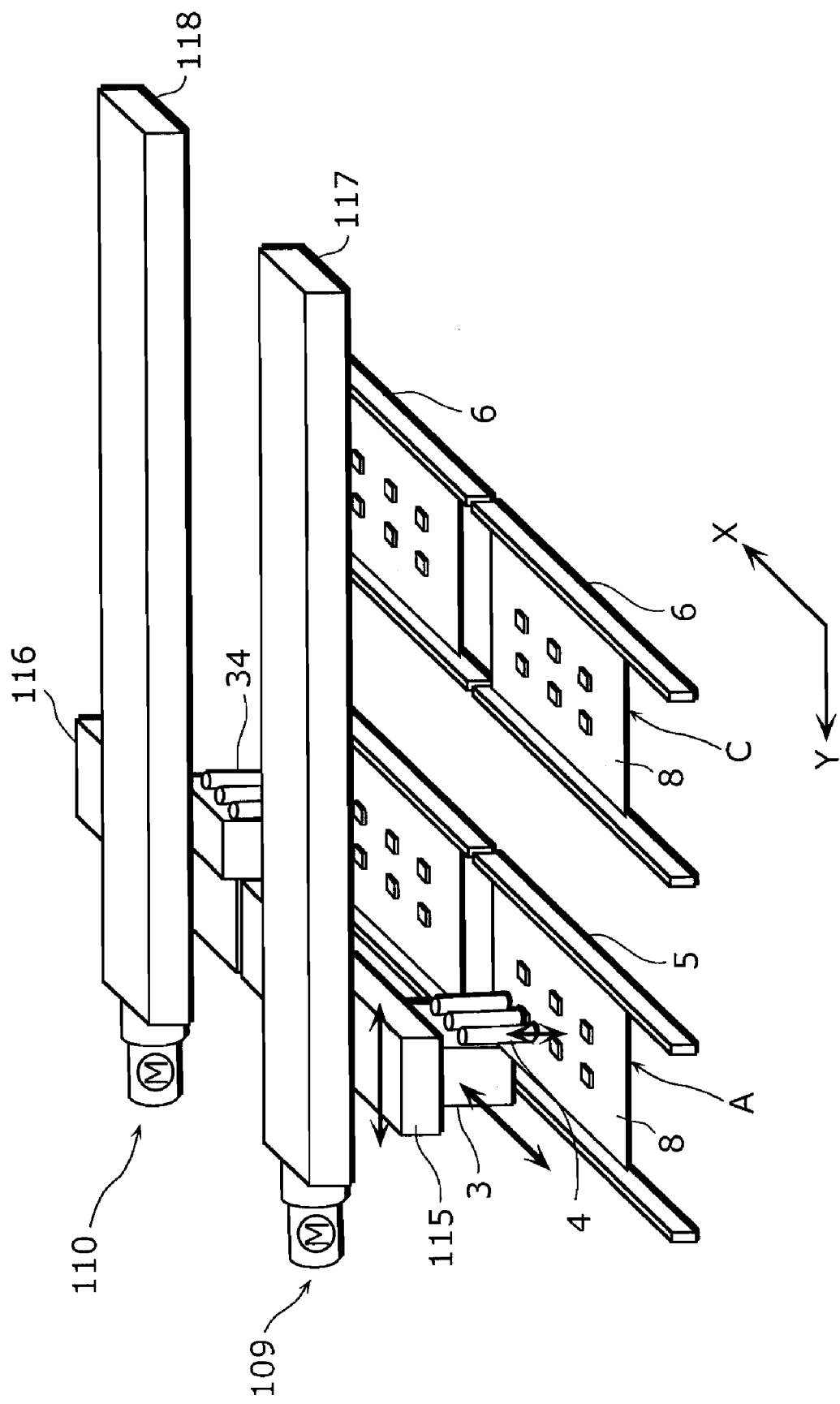
FIG. 2 is a perspective view showing main structural components of mounting stages prepared in a component mounting apparatus.

FIG. 2 is a perspective view showing main structural components of the mounting stages 109 and 110 included in the component mounting apparatus 101. The mounting stage 109 is in a board carrier line for the circuit boards 8 on which semiconductor chips are mounted by the first head unit 4.

Each of the structural components of the mounting stage 109 is described below in detail, and the following description is common for the mounting stage 110.

The beam trajectory 117 is a member having a high stiffness and is fixed in the component mounting apparatus 101 so that the beam can be moved along the trajectory from the back to front of the component mounting apparatus 101. A ball screw (not shown) which is driven by an AC servo-controlled motor M is set in this beam trajectory 117. A beam 115 attached to the beam trajectory 117 is driven by rotating the ball screw using the AC servo-controlled motor M.

The beam 115 attached to the beam trajectory 117 is a member along the carriage direction (X direction) of the circuit board 8 and can move in parallel with the beam trajectory 117 (Y direction). In addition, a linear motor (not shown) is provided in this beam 115, and the linear motor can drive the first head unit 4 attached to the beam 115 in a hanging-down manner in the X direction along the beam 115.

The first head unit 4 attached to the beam 115 is a unit which is capable of holding semiconductor chips and mounting them onto a board, and the first head unit 4 is capable of moving along the beam 115 (X direction). Accordingly, the range within which the semiconductor chips can be mounted onto a board is defined depending on the range within which the first head unit 4 can move along the beam 115.

In addition, the first head unit 4 (mounting heads) has plural suction nozzles 3 for holding semiconductor chips by vacuum-suctioning and mounting the semiconductor chips to be held on the circuit boards 8, and it is capable of suctioning and holding plural semiconductor chips, carrying them, and mounting them on the circuit boards 8.

When suctioning semiconductor chips, the first head unit 4 lowers the suction nozzles 3, suctions and holds the semiconductor chips supplied from the wafer 1, and raises the suction nozzles 3. Since the first head unit 4 has plural suction nozzles 3, it causes the respective suction nozzles 3 to suction and hold these semiconductor chips.

Next, these semiconductor chips are carried to the mounting points of the circuit boards 8 by moving the beam 115 and the first head unit 4. These mounting points are positions on the circuit boards 8 onto which the associated semiconductor chips should be mounted. These mounting points are defined based on a positional relationship between the mounting points and reference points selected on the circuit boards 8. Lastly, the first head unit 4 mounts the semiconductor chips onto the circuit boards 8 by lowering the suction nozzles 3.

Figure 3:
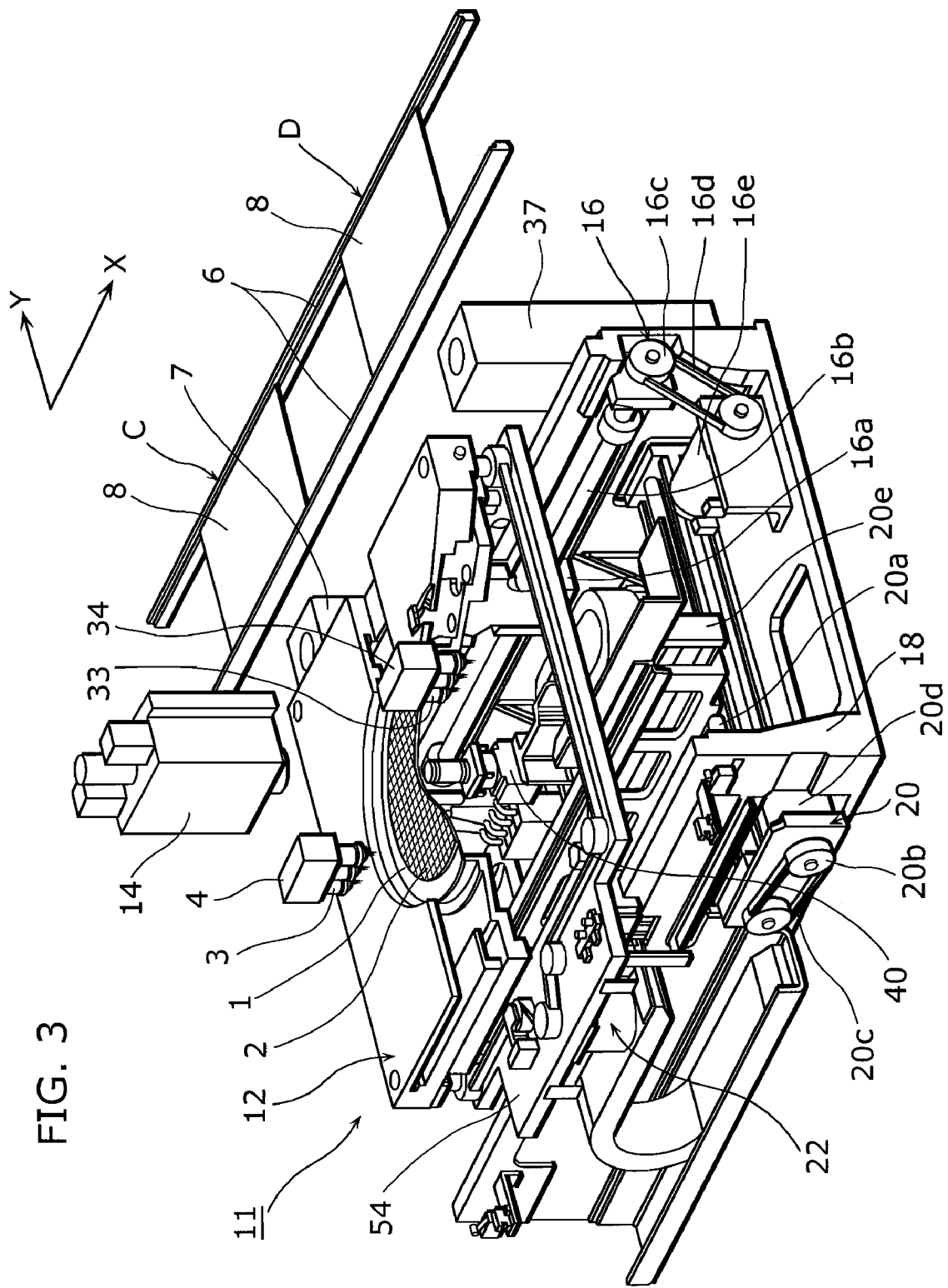
FIG. 3 is a perspective view of a component supplying device that the component mounting apparatus has.

FIG. 3 shows a perspective view (partially transparent view) mainly showing the structure of the component supplying device 11 in the component mounting apparatus 101 having the structure like this. A detailed description is given of the structure of the component supplying device 11 based on FIG. 3.

As shown in FIG. 3, the component supplying device 11 has a table supporting frame 18 which movably supports the holding table 12 in the X-axis direction shown in the figure and a table moving device 16 which drives the forward and backward movement (that is, reciprocal movement between the first component supplying position E and the second component supplying position F) of this supported holding table 12 in the X-axis direction. Further, the component supplying device 11 has: a thrusting device 40 which thrusts desired semiconductor chips 2 on the bottom surface, among the respective semiconductor chips 2 included in the wafer 1 held by the holding table 12; and a thrusting device moving device 20 which is an example of thrusting pin relatively moving device which enables position adjustment for thrusting the desired semiconductor chips 2.

Figure 4:
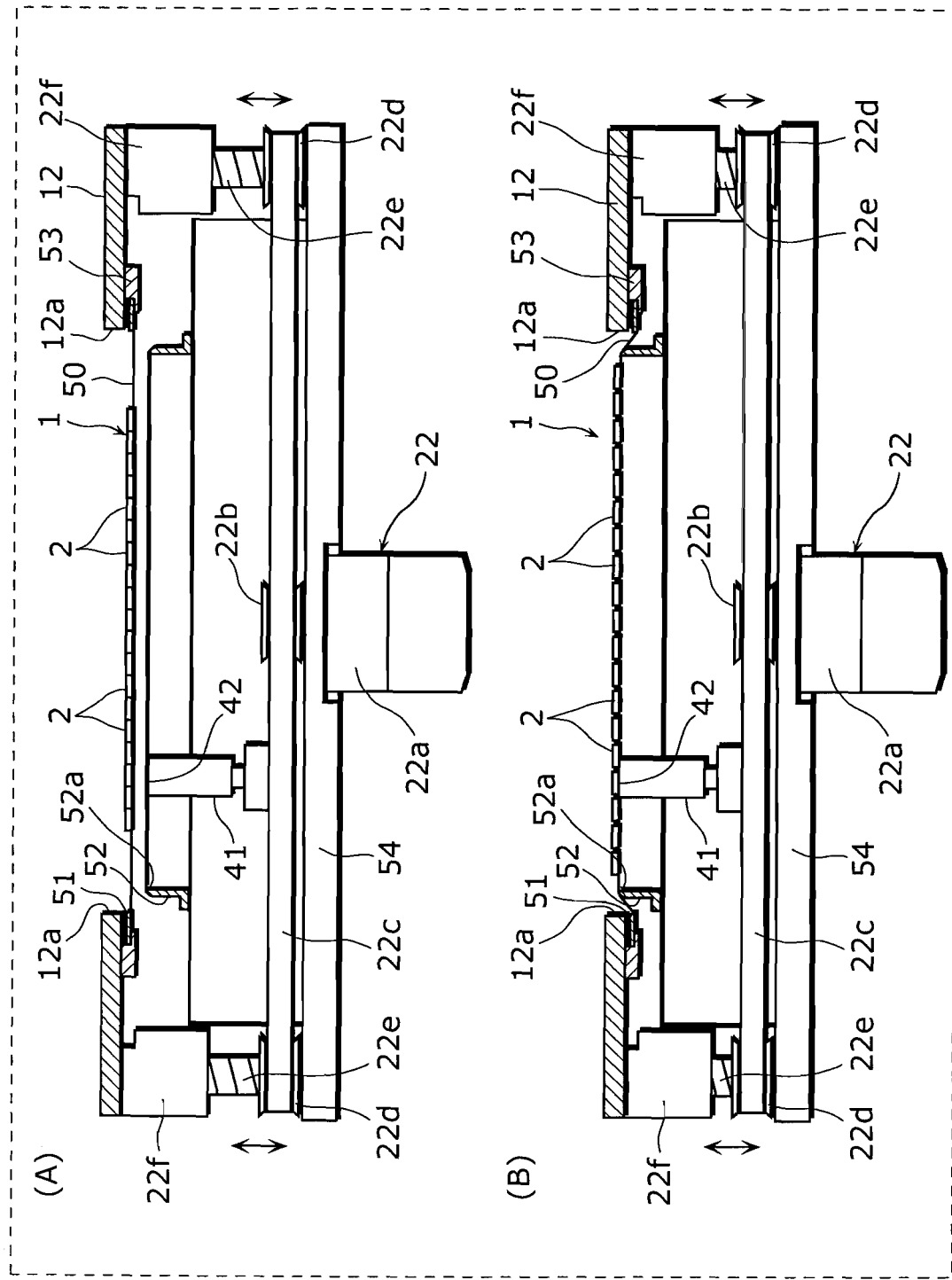
FIGS. 4(A) and 4(B) each is a section view showing the structure of a holding table and an expanding device that the component supplying device has.

Here, schematic section views showing the structure of the holding table 12 that the component supplying device 11 has are shown as FIGS. 4(A) and 4(B). As shown in FIG. 4(A), the wafer 1 which is disc-shaped and diced is peelably affixed on the upper surface of a wafer sheet 50 which is flexible. In addition, this wafer sheet 50 is affixed to the inside of a wafer ring 51 which has a ring shape. This wafer ring 51 is supported by a ring holding unit 53 of the holding table 12 and holds the wafer 1. Note that the holding table 12 has an inner hole having the approximately same size as that of the interior diameter of the wafer ring 51, and the wafer 1 affixed to the wafer sheet 50 fixed by the inner holes 12a is always exposed.

In addition, as shown in FIG. 4(A), a ring-shaped expanding member 52 having a diameter larger than the exterior diameter of the wafer 1 and smaller than the interior diameter of the wafer ring 51 is provided below the wafer sheet 50. As shown in FIG. 4(B), this expanding member 52 is a member for expanding the diced wafer 1 by radially expanding the wafer sheet 50 starting with a contact part 52a, making the wafer sheet 50 contact with the contact part 52a which is the upper end of the expanding member 52.

In addition, the holding table 12 is supported by a frame 54 through an expanding device 22 which is an example of a lowering and raising device which lowers and raises the holding table 12. The expanding device 22 has: nut units 22f fixed at the respective four corners on the bottom surface of the holding table 12; ball screw axis units 22e which are screwed with the respective nut units 22f and rotatably fixed at the corners of the bottom surface with the frame 54; rollers 22d fixed on the respective ball screw axis units 22e; a driving motor 22a having rollers 22b on the driving axis; and a driving belt 22c which drives to rotate the rollers 22b so as to communicate the rotation to the respective rollers 22d. Note that the driving motor 22a is capable of being driven to rotate normally and reversely.

Since the holding table 12 and the expanding device 22 are structured in this way as shown in FIG. 4(B), driving the driving motors 22a to rotate normally or reversely makes it possible to lower the nut units 22f screwed with the respective ball screw axis units 22e so as to lower the holding table 12. Thus, the wafer sheet 50 can be made to be in contact with the contact parts 52a by lowering the wafer sheet 50 positioned above the expanding member 52, and the wafer sheet 50 can be radially expanded from the contact parts 52a by further lowering it. In this way, it is possible to expand the wafer 1 and to generate the intervals of positions of the respective semiconductor chips 2 which constitute the wafer 1 (that is, to form gaps in between the semiconductor chips 2 adjacent to each other). Such expansion is performed in order to smoothly pick up semiconductor chips 2 by thrusting the semiconductor chips 2, preventing semiconductor chips 2 to be picked up from interfering with other semiconductor chips 2.

The thrusting device 40 has: a thrusting pin holding unit 41 which holds internal thrusting pins for thrusting semiconductor chips 2 affixed to the wafer sheet 50 on the bottom surfaces; and a thrusting pin raising and lowering device (not shown) which raises and lowers this thrusting pins.

Figure 5:
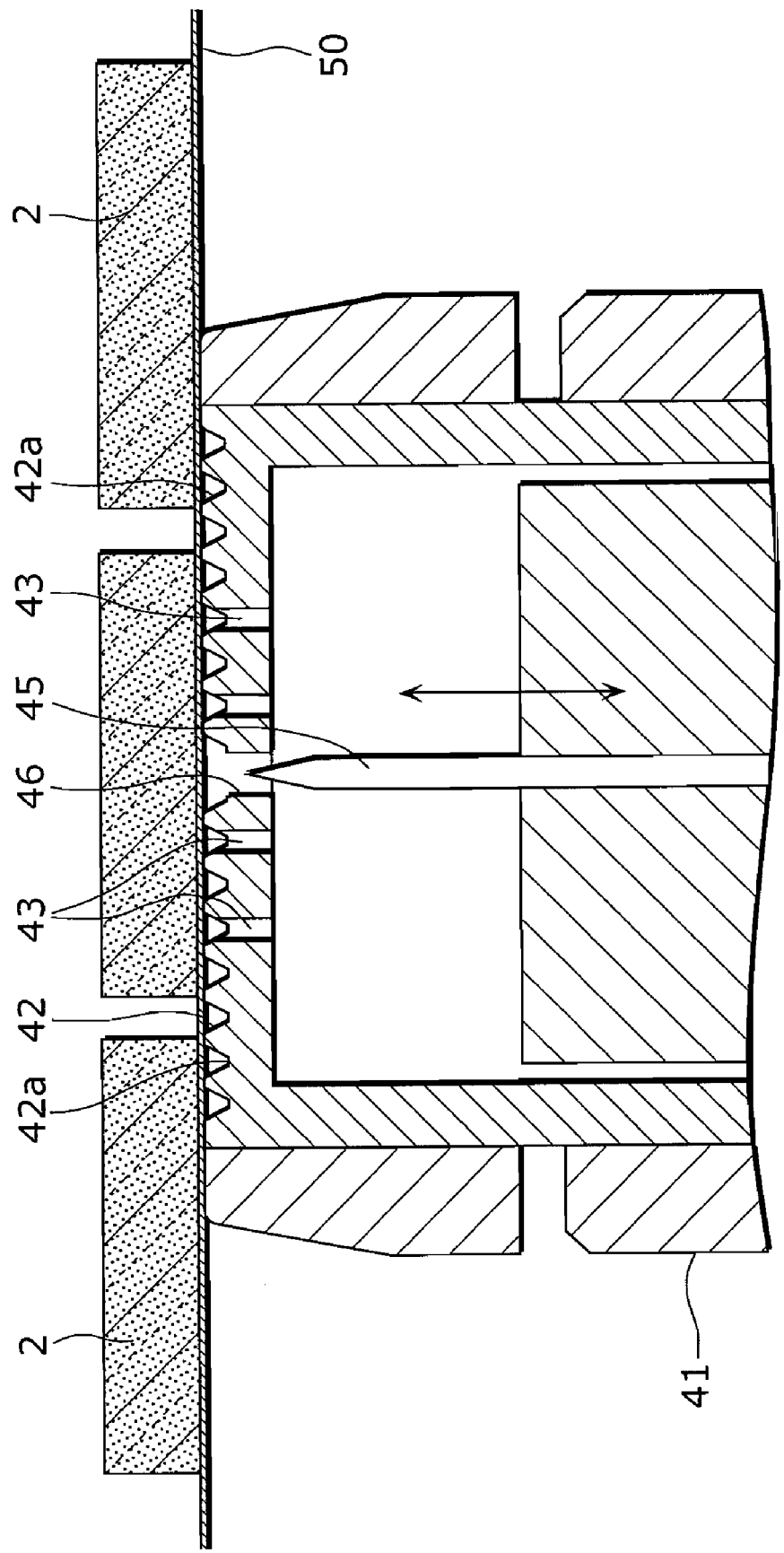
FIG. 5 is an external perspective view of a thrusting device that the component supplying device has.

The thrusting pin holding unit 41 has a sheet contact surface 42, as an example of the sheet contact part, which suctions and holds the wafer sheet 50 and is made to be in contact with the wafer sheet 50 on the edge part. Here, FIG. 5 shows a schematic enlarged section view of the sheet contact surface 42 of the thrusting pin holding unit 41. As shown in FIG. 5, plural suction holes 43 are formed on the sheet contact surface 42. Thus, it is possible to suction the wafer sheet 50 in close contact with the sheet contact surface 42 and securely hold the wafer sheet 50. In addition, since plural convex parts 42a are formed on the sheet contact surface 42, the close contact prompts to improve peelability, from the wafer sheet 50, of the semiconductor chips 2 positioned above the sheet contact surface 42. In addition, pin storage holes 46 are formed on the part which is approximately in the middle of the sheet contact surface 42, and the thrusting pins 45 are stored in the thrusting pin holding unit 41 so that the thrusting pins 45 can thrust out from these pin storage holes 46.

In addition, a method for raising and lowering thrusting pins 45 by converting rotation movement caused by a driving motor into up-down movements by cam and corn follower is employed for the thrusting pin raising and lowering device.

Figure 6:
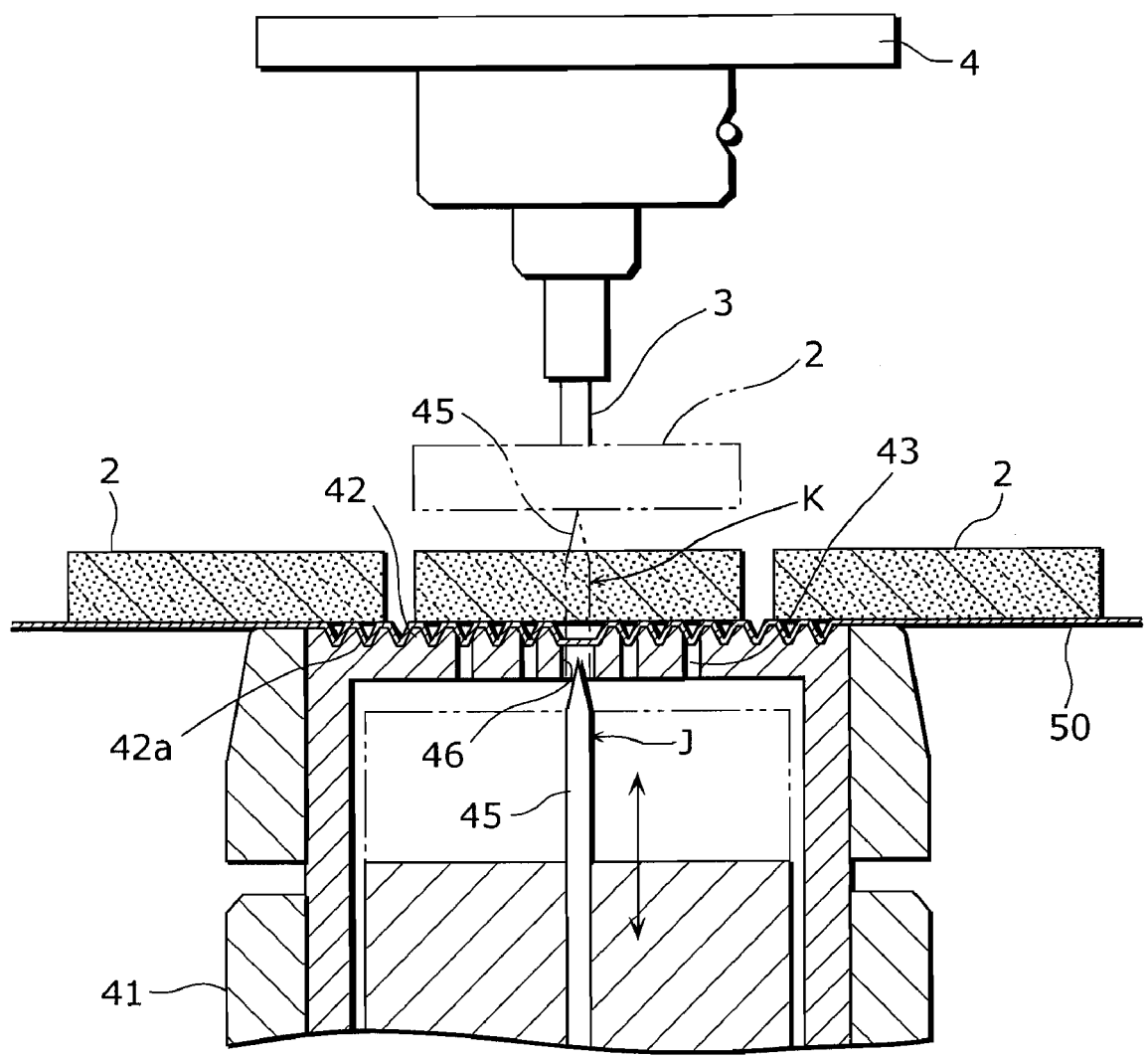
FIG. 6 is an enlarged schematic section view of a thrusting pin holding unit in the thrusting device, and shows a state where thrusting pins are positioned at thrusting positions.

As shown in FIG. 6, with the thrusting pin raising and lowering device structured like this, it becomes possible to perform raising and lowering operations of the thrusting pins 45 in between a storage position J where the trusting edges in the edge parts of the thrusting pins 45 do not thrust out from the pin storage holes 46 and a thrusting position K where the thrusting edges of the thrusting pins 45 thrust the semiconductor chips 2 positioned above the sheet contact surface 42. In addition, it is possible to perform the peeling easily and securely because the wafer sheet 50 is suctioned and held on the sheet contact surface 42 in the case of peeling off the semiconductor chips 2 from the wafer sheet 50 by raising the thrusting pins 45 through the wafer sheet 50 so as to thrust the bottom surfaces of the semiconductor chips 2.

In addition, as shown in FIG. 3, the thrusting device 40 is capable of moving in the X-axis direction or the Y-axis direction in the figure by the X-axis moving unit 20e which supports the thrusting device 40 and has a driving unit (not shown) moving the thrusting device 40 in the shown X direction and by the thrusting device moving device 20 which has the Y-axis moving unit composed of: a ball screw axis unit 20a which is screwed with the nut unit (not shown) fixed on the X-axis moving unit 20e; a driving motor 20d which drives the ball screw axis unit 20a to rotate; a roller 20b which drives to communicate the rotation to the ball screw axis unit 20a; and a driving belt 20c. Since the thrusting device 40 is capable of moving in the X-axis direction or the Y-axis direction in this way, it becomes possible to adjust the thrusting position where the thrusting pins 45 thrust desired semiconductor chips 2 in a wafer 1.

In addition, such position adjustment is performed, as shown in FIG. 5 for example, in a state where the sheet contact surface 42 is made to be in contact with the bottom surface of the wafer sheet 50 in the thrusting pin storage unit 41 where the thrusting pins 45 are positioned at the storage position J (refer to FIG. 6) and where the wafer sheet 50 is not suctioned through the respective suction holes 43. In other words, as shown in FIGS. 4(A) and 4(B), the sheet contact surface 42 in the thrusting pin holding unit 41 is arranged so as to be approximately flush with the contact parts 52a of the expanding member 52, and the bottom surface of the expanded wafer sheet 50 is always made to be in contact with the sheet contact surface 42.

In addition, as shown in FIG. 3, the table moving device 16 has: a nut unit 16a fixed on the frame 54 which supports the holding table 12; a ball screw axis unit 16b which is screwed with the nut unit 16a and placed in the shown X-axis direction; a driving motor 16e which drives the ball screw unit 16b to rotate; a roller 16c which communicates the rotation caused by the driving motor 16e to the ball screw axis unit 16b; and a driving belt 16d. Driving the driving motor 16e to rotate in any of normal and reverse directions makes it possible to move the holding table 12 forwardly and backwardly along the shown X-axis direction through the ball screw axis 16b and the nut unit 16a.

The procedure of the mounting operation starting with picking up semiconductor chips 2 from a wafer 1 and ending with mounting them onto circuit boards 8 executed in the component mounting device 101 having the above-described structure is described below based on the schematic plan views illustrating the procedure of the component mounting operation executed by the component mounting apparatus 101 shown in FIG. 7 to FIG. 11. Note that the respective operations to be described below are centrally executed in association with each other by a mounting control device (not shown) that the component mounting apparatus 101 has.

Figure 7:
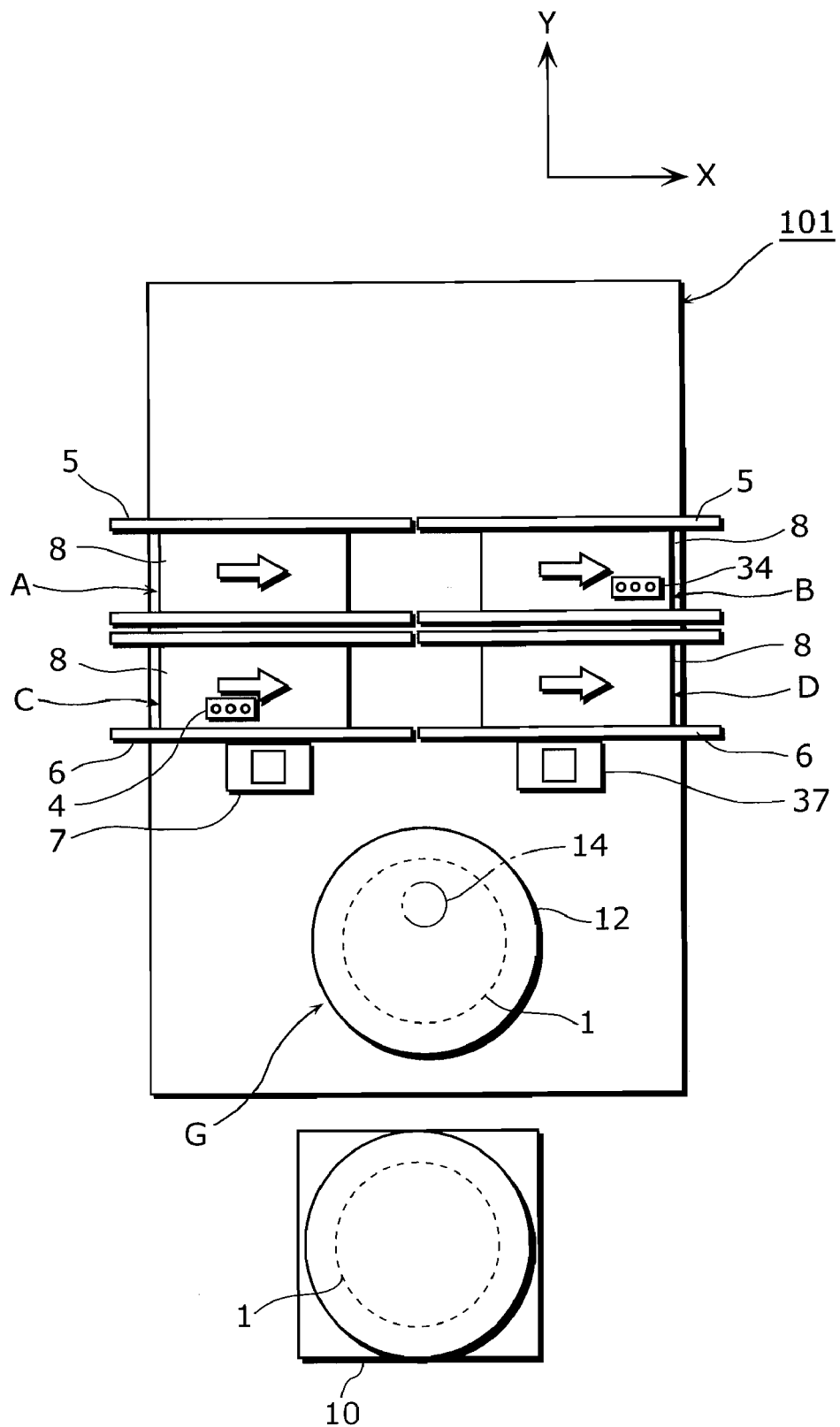
FIG. 7 is a schematic plan view illustrating the procedure of the component mounting operation executed by the component mounting apparatus, and shows a state where a wafer picked up from a wafer magazine is held on the holding table.

First, as shown in FIG. 7, in the component mounting apparatus 101, four circuit boards 8 supported by carrier rails 5 and carrier rails 6 are carried rightward in the shown X-axis direction and are respectively positioned at the first board holding position A, the second board holding position B, the third board holding position C, and the fourth board holding position D. After the carriage is stopped, they are releasably held at the respective positions.

In parallel with this, a wafer 1 is selected and picked up from a wafer magazine 10 where plural wafers 1 are housed, supplied to the holding table 12 of the component supplying device 11 positioned at the wafer recognition position G, and releasably held. After that, the expanding device 22 performs an operation for expanding the wafer sheet 50 so as to expand the wafer 1. Performing this expansion operation realizes a state where the sheet contact surface 42 of the thrusting pin holding unit 41 is always made to be in contact with the bottom surface of the wafer sheet 50. Note that the wafer sheet 50 has not yet been suctioned and held through the respective suction holes 43 in this state.

Subsequently, from among the respective semiconductor chips 2 which constitute the expanded wafer 1, for example, a semiconductor chip 2 which should be mounted onto a circuit board 8 held at the first board holding position A is selected, and the positions of the selected semiconductor chip 2 and the wafer camera 14 are adjusted. Note that this position adjustment is executed by moving the wafer camera 14 along the Y-axis direction and causing the table moving device 16 to move the holding table 12 in the X-axis direction. After the position adjustment, the wafer camera 14 captures an image of the selected semiconductor chip 2. The captured image is recognized by the mounting control device, and the amount of misalignment between the predetermined position and the actual position of the semiconductor chip 2 with respect to the wafer 1 is calculated. The data indicating the amount of misalignment is temporally stored in a memory unit or the like in the mounting control device.

Figure 8:
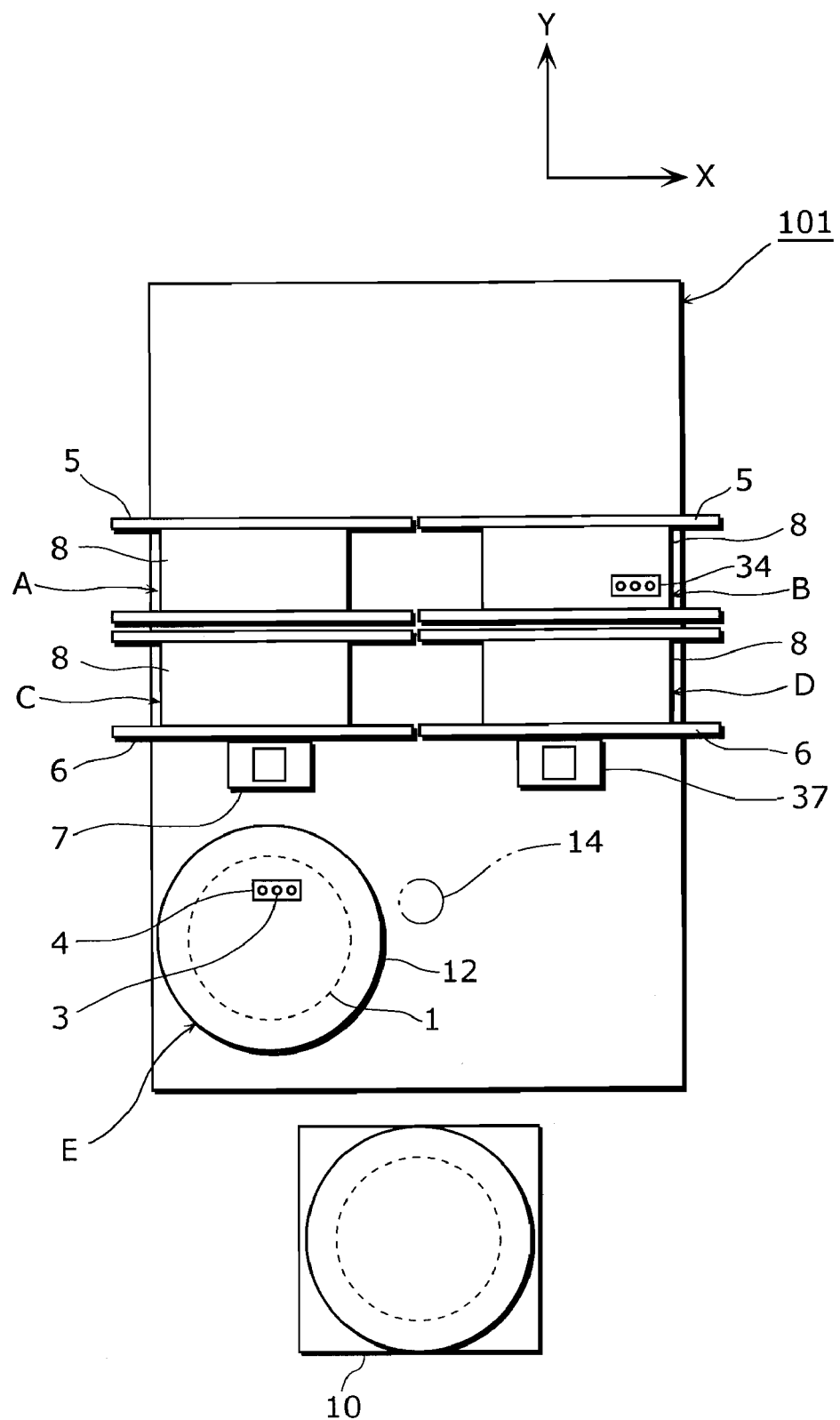
FIG. 8 is a schematic plan view illustrating the procedure of the component mounting operation executed by the component mounting apparatus, and shows a state where the holding table is positioned at a first position for supplying components.

When the images of the respective semiconductor chips 2 are captured by the wafer camera 14, the table moving device 16 moves the holding table 12 leftward in the shown X-axis direction so as to position the holding table 12 at the first component supplying position E, as shown in FIG. 8. At this time, the thrusting device moving device 20 moves the whole thrusting device 40 integrated with the holding table 12 to the first component supplying position E in a state where the sheet contact surface 42 of the thrusting pin holding unit 41 are contact with the wafer sheet 50. Subsequently, the thrusting device moving device 20 moves the thrusting pins 45 of the thrusting device 40 so as to be positioned below the semiconductor chip 2 which has been firstly selected, and the positions of the semiconductor chips 2 and the thrusting pins 45 are adjusted. Note that this timing of position adjustment may be replaced by the timing during which the holding table 12 is positioned at the wafer recognition position G or the holding table 12 is being moved from the wafer recognition position G to the first component supplying position E. In addition, this holding table 12 is moved in a state where the sheet contact surface 42 is always made to be in contact with the bottom surface of the wafer sheet 50. This makes it possible to prevent the wafer sheet 50 from swinging and vibrating due to the movement, and thus it is possible to prevent the respective semiconductor chips 2 from being misaligned.

Together with this movement, a first head unit 4 is moved by a not-shown first X-Y robot above the holding table 12 positioned at the first component supplying position E. Subsequently, the first X-Y robot adjusts the positions of a suction nozzle 3 that the first head unit 4 has and the firstly-selected semiconductor chip 2. In addition, in this position adjustment, the data indicating the amount of misalignment stored in the memory unit or the like of the mounting control device is read out, and the amount of misalignment is corrected based on the data.

Subsequently, as shown in FIG. 6, the wafer sheet 50 is suctioned through the respective suction holes 43 so as to be suctioned and held on the sheet contact surface 42. Under the state where the wafer sheet 50 is suctioned and held, the thrusting pins 45 are raised from the storage position J up to the thrusting position K by the thrusting pin raising and lowering device 44 so as to thrust the semiconductor chips 2. In this way, the semiconductor chips 2 are peeled off from the upper surface of the wafer sheet 50.

In synchronization with this peeling operation, the position-adjusted suction nozzle 3 of the first head unit 4 starts to be lowered so that the lower end of the suction nozzle 3 is made to be in contact with the upper surface of the peeled-off semiconductor chip 2. Upon this contact, the semiconductor chip 2 is suctioned and held by the suction nozzle 3. Subsequently, the suction nozzle 3 is raised, and the semiconductor chip 2 is picked up from the wafer 1.

After the first semiconductor chip 2 is picked up, positions of a second semiconductor chip 2, a thrusting pin 45 and another suction nozzle 3 are adjusted according to the same procedure as the one described above. In sequence, position adjustment for a third semiconductor chip 2 is performed according to the same procedure. In this way, the respective three suction nozzles that the first head unit 4 has suction and hold semiconductor chips 2.

Figure 9:
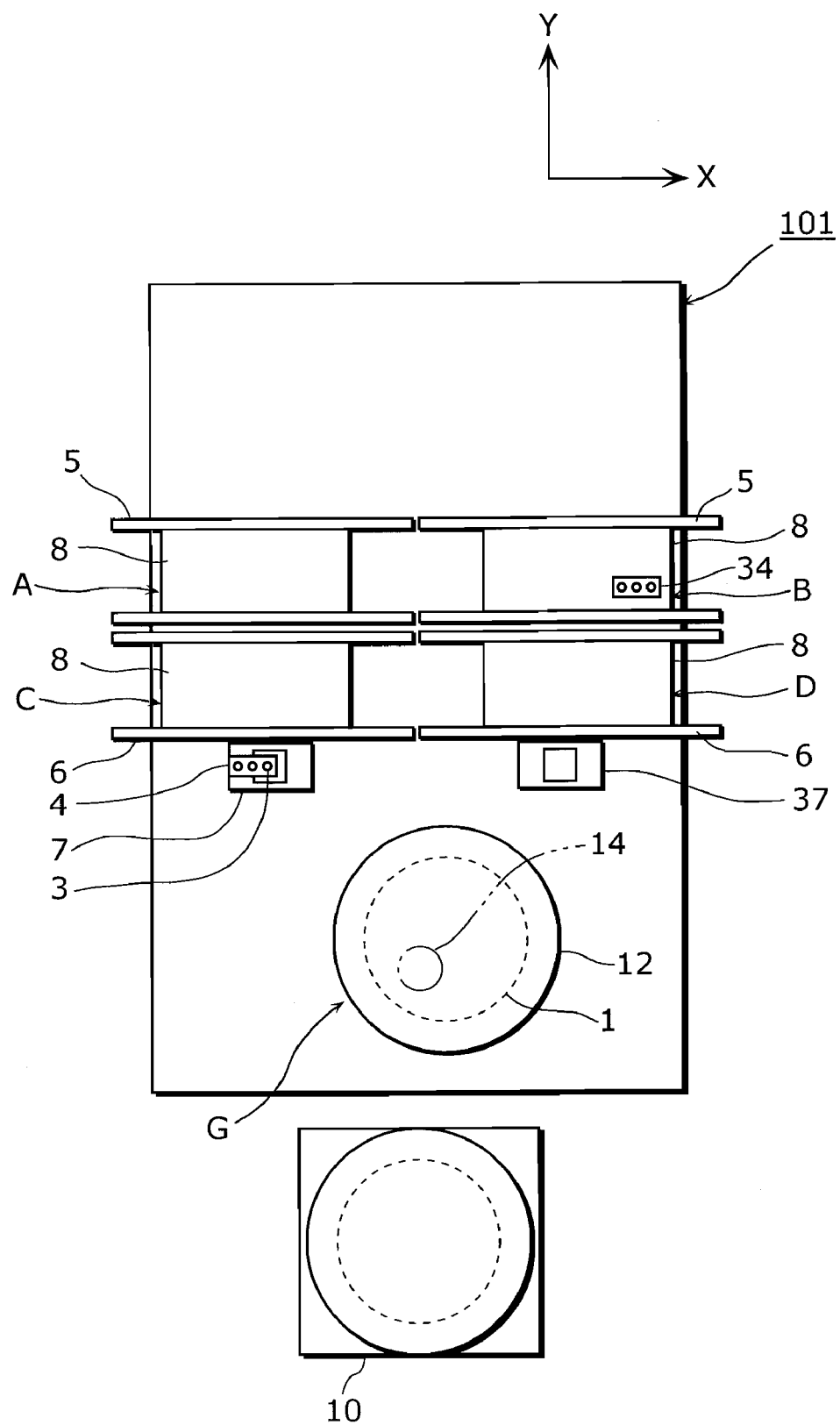
FIG. 9 is a schematic plan view illustrating the procedure of the component mounting operation executed by the component mounting apparatus, and shows a state where the holding table is positioned at a position for recognizing a wafer.

Subsequently, as shown in FIG. 9, the first head unit 4 suctioning and holding the respective semiconductor chips 2 start to be moved toward the first board holding position A. In the process of this movement, the respective suction nozzles 3 pass through above the first component recognition camera 7. In this passage, the first component recognition camera 7 captures an image of each semiconductor chip 2 in the attitude of the semiconductor chip 2 which is being suctioned and held. The data of captured images are inputted to the mounting control device, and a processing for recognizing the attitude of each semiconductor chip 2 which is being held in the image is executed.

On the other hand, the holding table 12 from which the respective semiconductor chips 2 have been picked up is moved rightward in the shown X-axis direction by the table moving device 16 so as to be positioned at the wafer recognition position G as shown in FIG. 9. Note that the thrusting device 40 integrated with the holding table 12 is moved by the thrusting device moving device 20 in this movement in a state where the sheet contact surface 42 is always in contact with the bottom surface of the wafer sheet 50. The sheet contact surface 42 is in the thrusting pin holding unit 41 having thrusting pins 45 positioned at the storage position J.

After the movement, a semiconductor chip 2 which should be mounted onto a circuit board 8 held by the board holding position B for example, is selected from among a wafer 1, and the position of the selected semiconductor chip 2 and the wafer camera 14 are adjusted. Subsequently, the wafer camera 14 captures an image of the semiconductor chip 2, and the mounting control device calculates the amount of misalignment based on the captured image. After the image capturing, other semiconductor chips 2 are sequentially selected, the same operation is performed on the respective semiconductor chips, and the amount of misalignment of each semiconductor chip 2 is calculated.

Figure 10:
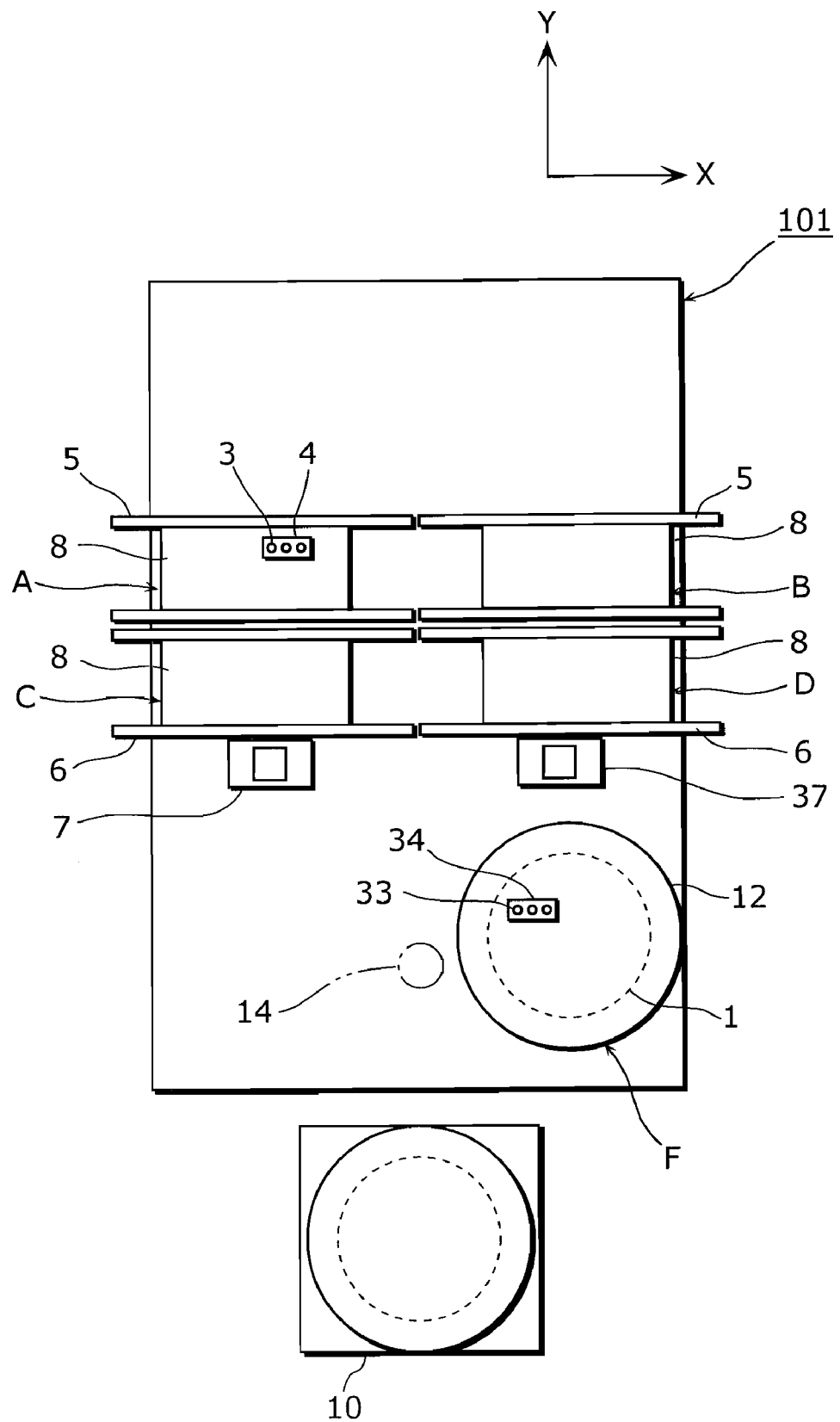
FIG. 10 is a schematic plan view illustrating the procedure of the component mounting operation executed by the component mounting apparatus, and shows a state where the holding table is positioned at a second position for supplying components.

Subsequently, as shown in FIG. 10, the first head unit 4 is moved above the circuit board 8 held at the first board holding position A, and operations of mounting the respective semiconductor chips 2 suctioned and held by the respective suction nozzles 3 onto circuit boards 8 are sequentially started. Note that these mounting operations are executed based on the results obtained by the processing of recognizing the attitude of each semiconductor chip 2 which is being suctioned and held, which has been executed by the mounting control device.

On the other hand, after the wafer camera 14 captures the images of the respective semiconductor chips 2, the holding table 12 is moved rightward in the shown X-axis direction by the table moving device 16 as shown in FIG. 10 so as to be positioned at the second component supplying position F. Note that the whole thrusting device 40 integrated with the holding table 12 is moved to the second component supplying position F by the thrusting device moving device 20 in a state where the sheet contact surface 42 of the thrusting pin holding unit 41 is made to be in contact with the wafer sheet 50. Subsequently, the thrusting pin 45 of the thrusting device 40 is moved by the thrusting device moving device 20 so as to be positioned below the firstly-selected semiconductor chip 2, and the positions of the semiconductor chip 2 and the thrusting pin 45 are adjusted.

Together with this movement, the second head unit 34 is moved by a not-shown second X-Y robot above the holding table 12 positioned at the second component supplying position F. Subsequently, the second X-Y robot adjusts the positions of a suction nozzle 33 that the second head unit 34 has and the firstly-selected semiconductor chip 2. In addition, in this position adjustment, the data indicating the amount of misalignment stored in the memory unit or the like of the mounting control device is read out, and the amount of misalignment is corrected based on the data.

Subsequently, as shown in FIG. 6, the wafer sheet 50 is suctioned through the respective suction holes 43 so as to be held on the sheet contact surface 42. Under the state where the wafer sheet 50 is suctioned and held, the thrusting pins 45 are raised from the storage position J up to the thrusting position K by the thrusting pin raising and lowering device 44 so as to thrust the semiconductor chips 2. In this way, the semiconductor chips 2 are peeled off from the upper surface of the wafer sheet 50.

In synchronization with this peeling operation, the position-adjusted suction nozzle 33 of the second head unit 34 starts to be lowered so that the lower end of the suction nozzle 33 is made to be in contact with the upper surface of the peeled-off semiconductor chip 2. Upon this contact, the semiconductor chip 2 is suctioned and held by the suction nozzle 33. Subsequently, the suction nozzle 33 is raised, and the semiconductor chip 2 is picked up from the wafer 1. Likewise, second and third semiconductor chips 2 are sequentially suctioned and picked up according to the same procedure. In this way, the suction nozzle 33 that the second head unit 34 has suctions and holds the semiconductor chips 2.

Figure 11:
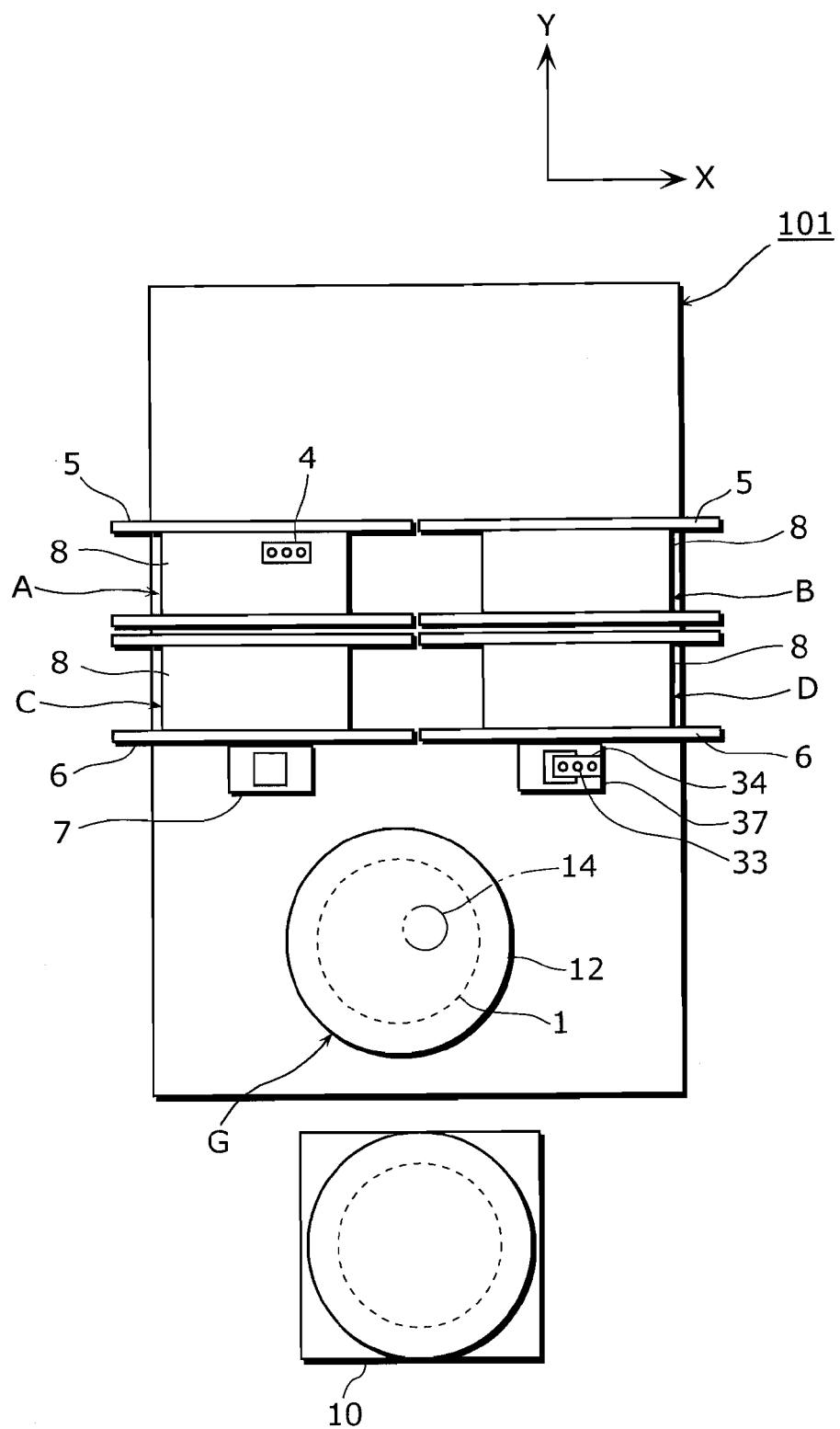
FIG. 11 is a schematic plan view illustrating the procedure of the component mounting operation executed by the component mounting apparatus, and shows a state where a second camera for recognizing components recognizes semiconductor chips held by a second head unit.
Figure 12:
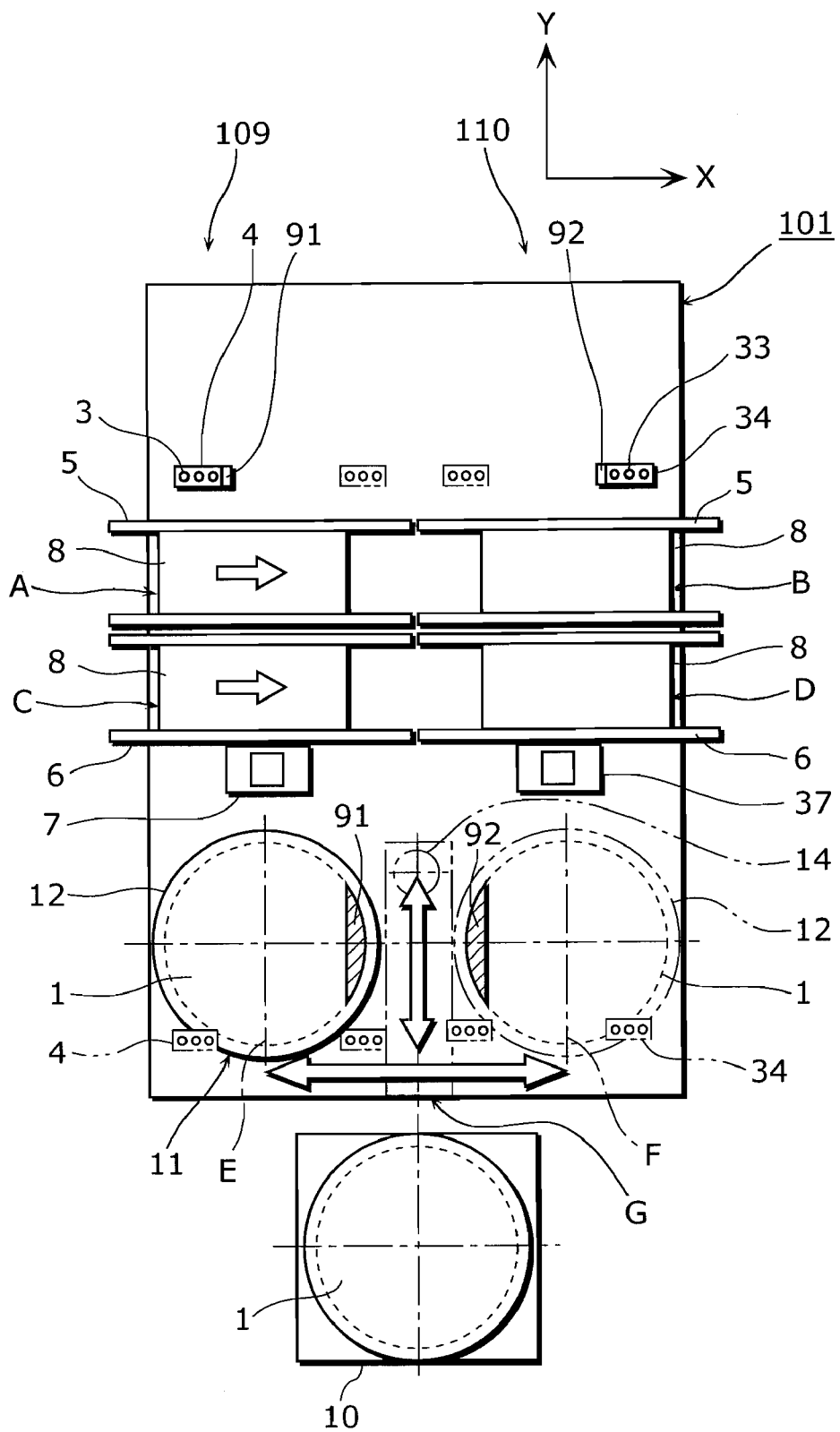
FIG. 12 is a schematic plan view of the component mounting apparatus according to a first embodiment of the present invention.

Subsequently, as shown in FIG. 11, the second head unit 34 suctioning and holding the respective semiconductor chips 2 starts to be moved toward the second board holding position B. In the process of this movement, the respective suction nozzles 33 pass through above the second component recognition camera 37. In this passage, the second component recognition camera 37 captures images of each semiconductor chip 2 in the attitude of the semiconductor chip 2 which is being suctioned and held. The data of captured images are inputted to the mounting control device, and a processing for recognizing the attitude of the semiconductor chip 2 which is being held in the image is executed.

Subsequently, the second head unit 34 is moved above the circuit board 8 held by the second board holding position B, and operations of mounting the respective semiconductor chips 2 onto circuit boards 8 are executed.

Note that the first head unit 4 which has completed the above mounting operations can repeatedly suction and pick up new semiconductor chips 2 after the respective semiconductor chips 2 are suctioned and picked up at the second component supplying position F and the holding table 12 is moved again to the first board supplying position E via the wafer recognition position G. In this case, it is preferable that the holding table 12 is moved so as to be positioned at the first board supplying position E by the time when the first head part 4 which has been completed the above mounting operations is moved again so as to be positioned at the first component supplying position E. This movement makes it possible to cut operation losses of the respective first head unit 4 and holding table 12 in order to supply components efficiently.

In addition, the above descriptions of mounting operations are given of the case where the respective semiconductor chips 2 are mounted onto the circuit boards 8 held at the first board holding position A or the second board holding position B. However, it is possible to mount the respective semiconductor chips 2 onto the circuit boards 8 held by the third board holding position C and the fourth board holding position D according to the same procedure.

The above description as to the component mounting apparatus 101 is given assuming that the wafer 1 has a diameter of 8 inches, but the component mounting apparatus 101 is capable of mounting components onto circuit boards 8 by picking up the semiconductor chips 2 from, for example, a wafer 1 having a diameter of 12 inches that is bigger than the wafer 1 having a diameter of 8 inches. However, there is a limit on the range within which the first head unit 4 and the second head unit 34 can move in the X-axis direction. In other word, when the wafer 1 shown in the figure moves to the mounting stage 109 located at the left side in the figure, the second head unit 34 cannot suction any semiconductor chip 2 from the wafer 1 as a matter of course, and there is a wafer area where even the first head 4 cannot suction any semiconductor chip 2. Such a suction-restricted area 91 is generated in the right end of the wafer 1 because of the limit on the movable range of the first head 4. Consequently, the wafer 1 must be moved to the mounting stage 110 located at the right side in the figure in order to enable the second head unit 34 to suction semiconductor chips 2 which remain in the suction-restricted area 91 of the wafer 1.

Likewise, in the case where the wafer 1 is moved to the mounting stage 110 at the right side in the figure, a suction-restricted area 92 is generated at the left end of the wafer 1. Even the second head unit 34 in addition to the first head unit 4 cannot suction any semiconductor chips 2 in the suction-restricted area 92. Thus, the wafer 1 must be moved to the mounting stage 109 located at the left side in the figure in order to enable the first head unit 4 to suction semiconductor chips 2 which remain in the suction-restricted area 92 of the wafer 1.

In this way, suction-restricted areas where semiconductor chips 2 can be picked up by only one of the head units are generated due to the upsizing of the wafer 1. This results in reducing efficiency in manufacturing circuit boards 8 unless an appropriate order of suctioning semiconductor chips 2 is determined. For example, in the case where only the semiconductor chips 2 in the suction-restricted area 91 of the wafer 1 finally remain, only the second head unit 34 sequentially executes mounting operations of semiconductor chips 2 in a state where the wafer 1 is moved to the right-side mounting stage 110 and the first head unit 4 is paused. This is a breakdown of the cooperated operations by the first head unit 4 and the second head unit 34.

A description is given below of the processing of determining the suction order according to which the component mounting apparatus 101 suctions the semiconductor chips 2 from the wafer 1.

Figure 13:
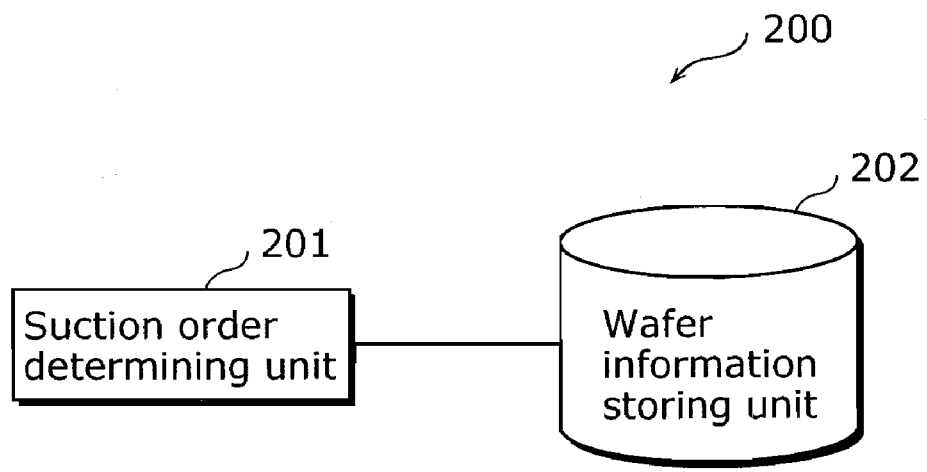
FIG. 13 is a block diagram showing the functional structure of a suction order determining device according to the first embodiment of the present invention.

FIG. 13 is a block diagram showing the functional structure of the suction order determining apparatus.

The suction order determining apparatus 200 determines the suction order according to which the component mounting apparatus 101 suctions semiconductor chips 2 in the wafer, and include a suction order determining unit 201 and a wafer information storage unit 202.

The wafer information storage unit 202 stores information about the arrangement of the semiconductor chips 2 in a wafer 1 and the positions of the suction-restricted areas 91 and 92 of the wafer 1.

The suction order determining unit 201 determines the suction orders according to which the first head unit 4 and the second head unit 34 suction the semiconductor chips 2 included in the wafer 1, based on the information stored in the wafer information storage unit 202.

The suction order determining unit 201 of the suction order determining device 200 is realized as a program executed on a computer (not shown), and the wafer information storage unit 202 is realized as a main memory or a hard disc of the computer. Note that the component mounting apparatus 101 may have the functions of the suction order determining apparatus 200.

Figure 14:
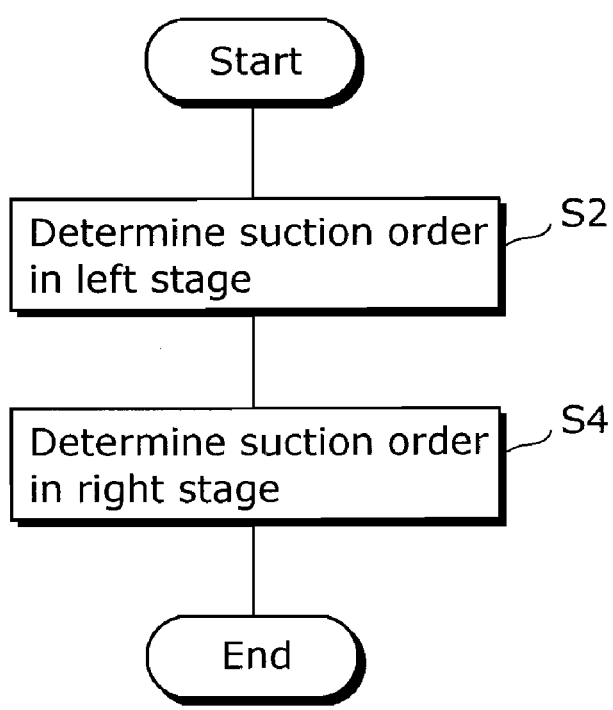
FIG. 14 is a flowchart of a processing executed by the suction order determining device.

FIG. 14 is a flowchart of the processing executed by the suction order determining unit 201.

Figure 15:
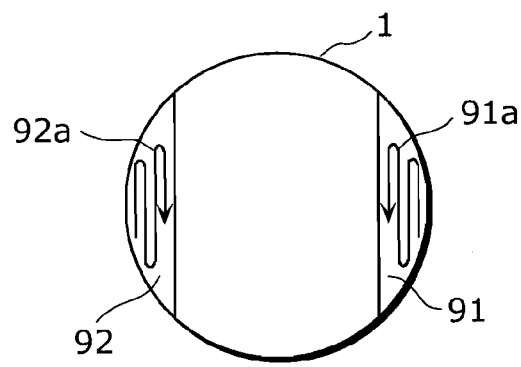
FIG. 15 is a diagram for illustrating a suction order for semiconductor chips in a wafer.

The suction order determining unit 201 determines the suction order according to which the first head unit 4 provided in the left-side mounting stage 109 suctions semiconductor chips (S2). FIG. 15 is a diagram illustrating the suction order of semiconductor chips 2 in a wafer 1. More specifically, the suction order determining unit 201 determines the suction order according to which the first head unit 4 suctions semiconductor chips 2 in the direction from the left end to the center of the wafer 1. The arrow 92a shows the suction order by the first head unit 4.

Next, the suction order determining unit 201 determines the suction order according to which the second head unit 34 provided in the right-side mounting stage 110 suctions semiconductor chips 2 (S4). More specifically, as shown in FIG. 15, the suction order determining unit 201 determines the suction order according to which the second head unit 34 suctions semiconductor chips 2 in the direction from the right end to the center of the wafer 1. The arrow 91a shows the suction order by the second head unit 34.

In this way, the suction orders are determined so that the first head unit 4 firstly suctions the semiconductor chips 2 in the suction-restricted area 92 for the second head unit 34, and the second head unit 34 firstly suctions the semiconductor chips 2 in the suction-restricted area 91 for the first head unit 4.

As for the execution order of the suction order determination processes (S2 and S4), the process of S4 is executed after the execution of the process of S2. However, note that the process of S2 may be executed after the execution of the process of S4, and that the process of S2 and the process of S4 may be executed in parallel. In other words, there is no limit on the execution order of the processes on condition that the suction order by the first head unit 4 and the suction order by the second head unit 34 can be respectively determined.

Figure 16:
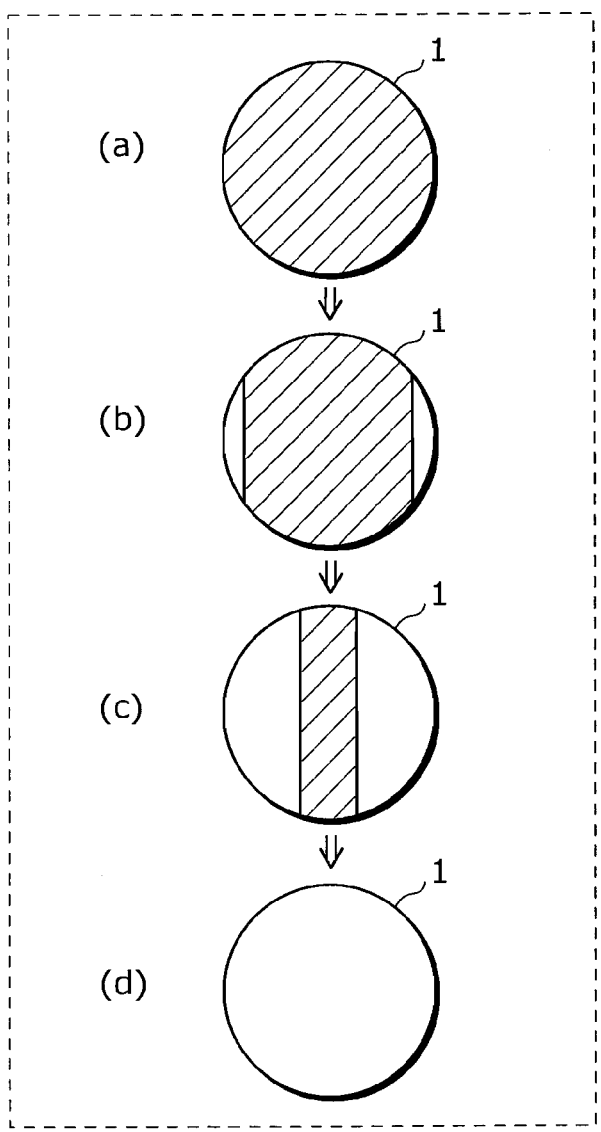
FIG. 16 is a diagram showing the process of suctioning the semiconductor chips on a wafer according to the determined suction order.

FIG. 16 is a diagram showing the suction process of the semiconductor chips 2 on the wafer 1. The shaded parts in the figure show areas where semiconductor chips 2 still remain, and the unshaded parts show areas where no semiconductor chips remain. When semiconductor chips 2 are sequentially suctioned according to the above-mentioned suction order in the initial state shown in FIG. 16(a), semiconductor chips 2 are sequentially suctioned starting with the semiconductor chips in the left end and the right end; that is, in the suction-restricted area 92 and the suction-restricted area 91 of the wafer 1, as shown in FIG. 16(b). Subsequently, when the suction of the semiconductor chips 2 proceeds further, the semiconductor chips 2 at and around the center part of the wafer 1 remain, as shown in FIG. 16(c). Finally, all the semiconductor chips 2 on the wafer 1 are suctioned, as shown in FIG. 16(d).

The respective first head unit 4 and second head unit 34 have three suction nozzles 33. Thus, semiconductor chips 2 decrease by three each time each head unit executes a suction operation. In other words, the right and left areas where suction of semiconductor chips is completed shown in FIGS. 16(b) and 16(c) are approximately symmetrical to each other.

According to this suction method, the semiconductor chips 2 which remain in the suction-restricted area 92 and the suction-restricted area 91 are suctioned at an earlier stage of the suction operation of the semiconductor chips 2. Thus, only the area where the components can be suctioned by any of the head units remains at the later stage of the suction operation (FIG. 16(c)). Therefore, the first head part 4 and the second head unit 34 can alternately execute suction operations on the semiconductor chips 2 corresponding to a single wafer throughout the suction operations; that is, it is possible to cause the first head unit 4 and the second head unit 34 to execute cooperated operations. This eliminates the possibility that semiconductor chips 2 are mounted onto circuit boards 8 using one of the head units only and pausing the other head unit. This enables the two head units to execute cooperated operations so as to mount semiconductor chips 2. Therefore, it becomes possible to improve efficiency in manufacturing circuit boards 8.

As shown in FIG. 16, the first embodiment has been conceived assuming that the first head unit 4 and the second head unit 34 start to suction the semiconductor chips 2 in a new wafer 1 where all the semiconductor chips remain.

Figure 17:
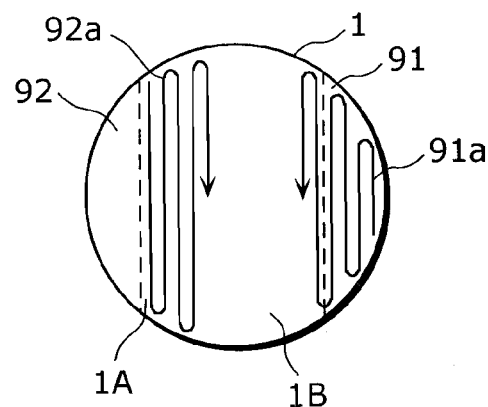
FIG. 17 is a diagram for illustrating a suction order of the semiconductor chips in the wafer.

However, in reality, the first head unit 4 and the second head unit 34 not always start to suction semiconductor chips 2 from a new wafer 1. For example, as shown in FIG. 17, the first head unit 4 and the second head unit 34 may start to suction semiconductor chips 2 from a wafer 1 having an area 1A from which semiconductor chips 2 have been picked up for use and where no semiconductor chips 2 remain. In this case, the first head unit 4 and the second head unit 34 pick up semiconductor chips from the area 1B where semiconductor chips remain. Even in the case of starting to suction semiconductor chips 2 from such an in-process wafer 1, it is possible to suction the semiconductor chips 2 which remain in the suction-restricted area 91 and the suction-restricted area 92 at an earlier stage of the suction operations of the semiconductor chips by executing the suction of the semiconductor chips according to the suction order shown in the first embodiment. More specifically, the first head unit 4 sequentially suctions the semiconductor chips 2 in the direction, shown by the arrow 92a, from the left end to the center of the wafer 1, and the second head unit 34 sequentially suctions the semiconductor chips 2 in the direction, shown by the arrow 91a, from the right end to the center of the wafer 1.

Figure 18:
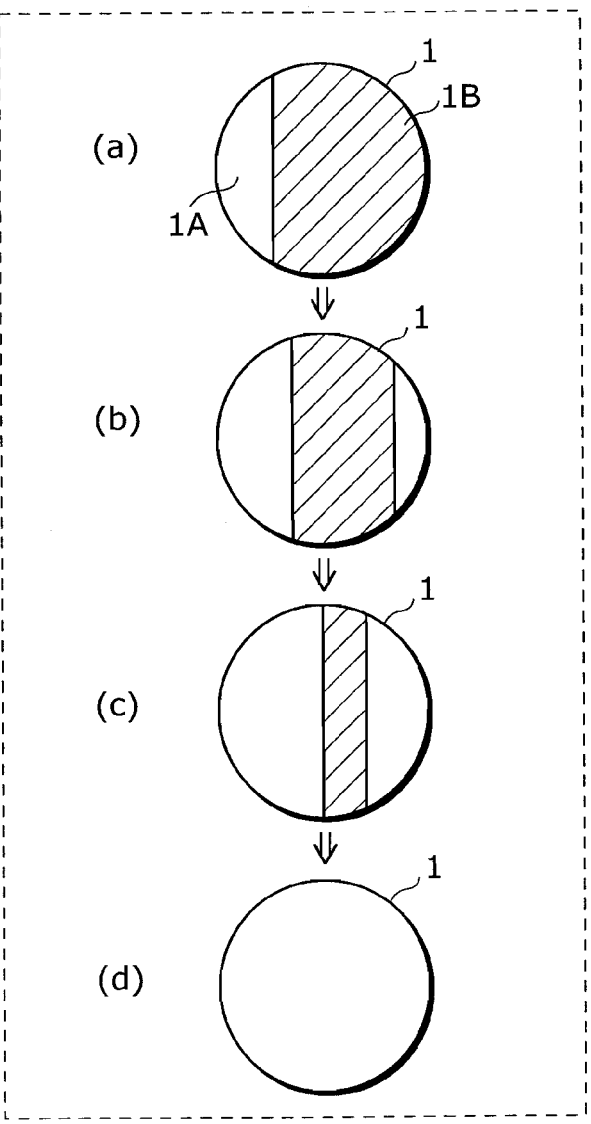
FIG. 18 is a diagram showing the process of suctioning the semiconductor chips on a wafer according to the determined suction order.

FIG. 18 is a diagram showing the suction process of the semiconductor chips 2 on the wafer 1. The shaded parts in the figures show areas 1B where semiconductor chips 2 still remain, and the unshaded parts show areas 1A where no semiconductor chips remain. Here, the area 1A is on the left side of the wafer 1. When semiconductor chips 2 are sequentially suctioned according to the above-mentioned suction order in the initial state shown in FIG. 18(a), semiconductor chips 2 are sequentially suctioned starting with the semiconductor chips in the left end and the right end of the area 1B, as shown in FIG. 18(b). Subsequently, when the suction of the semiconductor chips 2 proceeds further, the semiconductor chips 2 at and around the center part of the area 1B remain, as shown in FIG. 18(c). Finally, all the semiconductor chips 2 on the wafer are suctioned, as shown in FIG. 18(d).

Second Embodiment

A second embodiment of the present invention will be described below. The structures of the component mounting apparatus 101 and the suction order determining apparatus 200 according to the second embodiment are the same as the ones shown in the first embodiment. The second embodiment is different in the processing of the suction order determining unit 201 of the suction order determining apparatus 200. This different point is mainly described in the following description.

Figure 19:
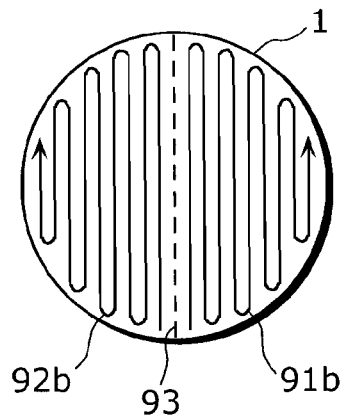
FIG. 19 is a diagram for illustrating a suction order of the semiconductor chips in the wafer.

As shown in FIG. 19, assuming that the wafer 1 has a border referred to as a center line 93 which is parallel to the Y-axis, the suction order determining unit 201 determines the suction order according to which the first head unit 4 suctions semiconductor chips 2 in the direction from the center line 93 to the left end (S2 of FIG. 14). The arrow 92b shows the suction order executed by the first head unit 4.

In addition, the suction order determining unit 201 determines the suction order according to which the second head unit 34 suctions semiconductor chips 2 in the direction from the center line 93 to the right end (S4 of FIG. 14). The arrow 91b shows the suction order executed by the second head unit 34.

Figure 20:
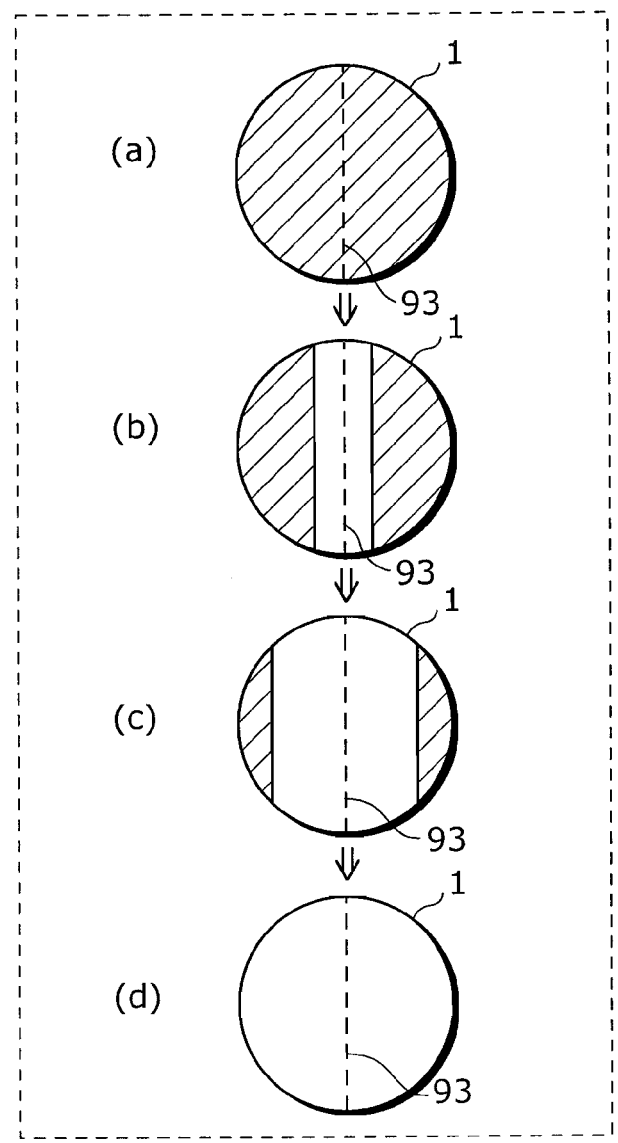
FIG. 20 is a diagram showing the process of suctioning the semiconductor chips on a wafer according to a determined suction order.

FIG. 20 is a diagram showing the process of suctioning the semiconductor chips 2 on the wafer 1 according to the determined suction order. The shaded parts in the figures show the areas where semiconductor chips 2 remain, and unshaded parts show the areas where no semiconductor chips 2 remain. When semiconductor chips 2 are sequentially suctioned according to the above-mentioned suction order in the initial state shown in FIG. 20(a), semiconductor chips 2 are sequentially suctioned equally in the ends positioned right and left from the center line 93 of the wafer 1, as shown in FIGS. 20(b) and 20(c). Finally, the first head unit 4 and the second head unit 34 complete the suction operations at approximately the same timings, as shown in FIG. 20(d). This is described more specifically. At least one component which is mounted in one iteration of a sequence of operations of suctioning, moving and mounting semiconductor chips 2 executed by each of the head units is referred to as a task here. In this case, the numbers of tasks are equal between the first head unit 4 and the second head unit 34, and the possibility that the first head unit 4 or the second head unit 34 suctions semiconductor chips 2 two times in sequence is eliminated.

Accordingly, the possibility that semiconductor chips 2 are mounted onto circuit boards 8 using one of the head units only and pausing the other one of the head units is eliminated. Therefore, it is possible to improve the efficiency in manufacturing circuit boards 8.

Note that this suction order holds good assuming that a circuit board 8 remains in each of the mounting stages 119 and 120. This suction order cannot be applicable, for example, in the case where a first circuit board 8 is carried and positioned at the mounting stage 109 only and no circuit board 8 remain in the mounting stage 110 at the time of starting manufacturing. Since the second head unit 34 of the mounting stage 110 is in a pause stage, the components cannot be suctioned equally and do not remain equally in the right and left in this case. Accordingly, the semiconductor chips 2 in the suction-restricted area 91 remain in the end.

Further, this suction order is applicable assuming that the first head unit 4 and the second head unit 34 start to suction semiconductor chips 2 on a new wafer 1 or a wafer 1 where the numbers of the remaining semiconductor chips 2 are symmetrical between the right and left. For example, in the case of a wafer 1 having an area 1A in the left side from which the semiconductor chips 2 have been picked up for use and where no semiconductor chips 2 remain as shown in FIG. 17, the number of semiconductor chips in the right side is greater than that in the left side of the wafer 1. Therefore, in the case of applying the suction order shown in the second embodiment, the semiconductor chips 2 of the suction-restricted area 91 remain in the end. Accordingly, in the final state, the first head unit 4 is paused and only the second head unit 34 can suction the semiconductor chips.

Third Embodiment

A third embodiment of the present invention will be described below. The third embodiment is different from the above-described embodiments in the point of determining the suction order of semiconductor chips by monitoring whether or not the numbers of remaining semiconductor chips are equal between the right and left sides in the wafer. The structure of the component mounting apparatus 101 according to the third embodiment is the same as the one shown in the first embodiment. The third embodiment is different from the first and second embodiments in the structure of the suction order determining apparatus 200. The different point is mainly described in the following description.

Figure 21:
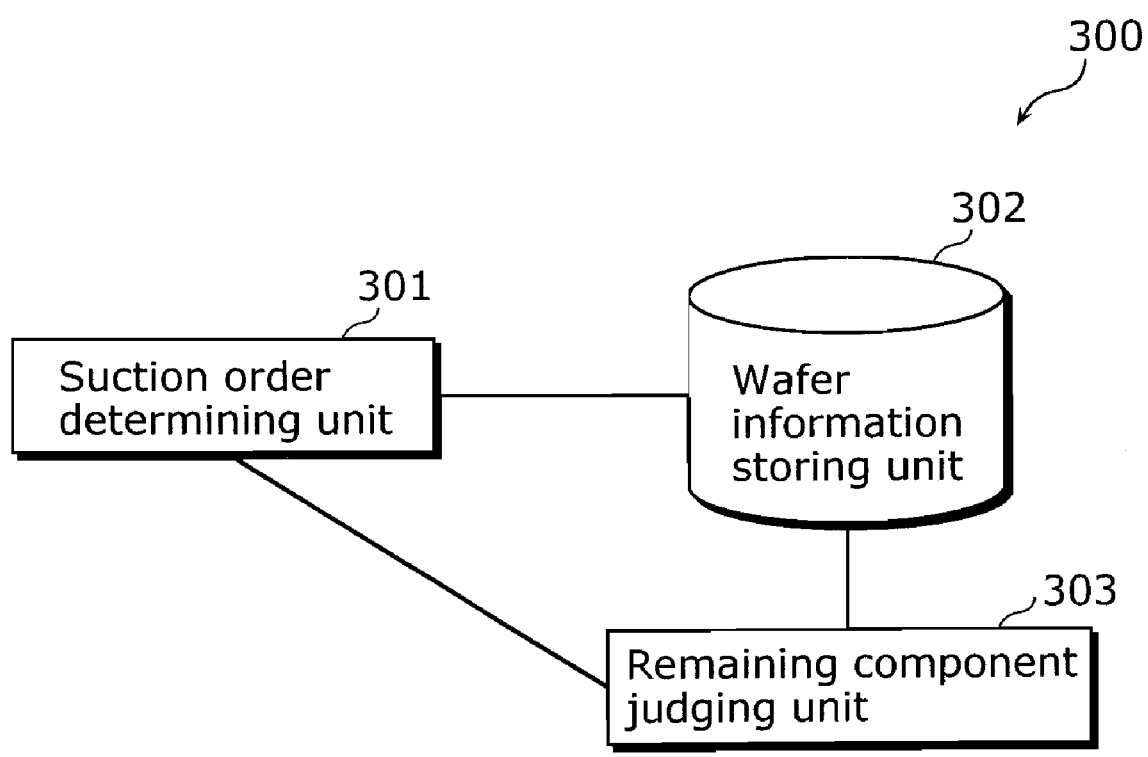
FIG. 21 is a block diagram showing the functional structure of the suction order determining device according to a third embodiment of the present invention.

FIG. 21 is a block diagram showing the functional structure of the suction order determining apparatus.

The suction order determining apparatus 300 determines the suction order according to which the component mounting apparatus 101 suctions semiconductor chips 2 in the wafer, and includes a suction order determining unit 301, a wafer information storage unit 302, and a remaining component judging unit 303.

The wafer information storing unit 302 stores information about the arrangement of the remaining semiconductor chips 2 in a wafer 1 and the positions of the suction-restricted areas 91 and 92 of the wafer 1.

The remaining component judging unit 303 judges the state of the remaining semiconductor chips 2 based on the information stored in the wafer information storing unit 302.

The suction order determining unit 301 determines the suction orders of the semiconductor chips 2, based on the information stored in the wafer information storage unit 302 and the judgment made by the remaining component judging unit 303.

Figure 22:
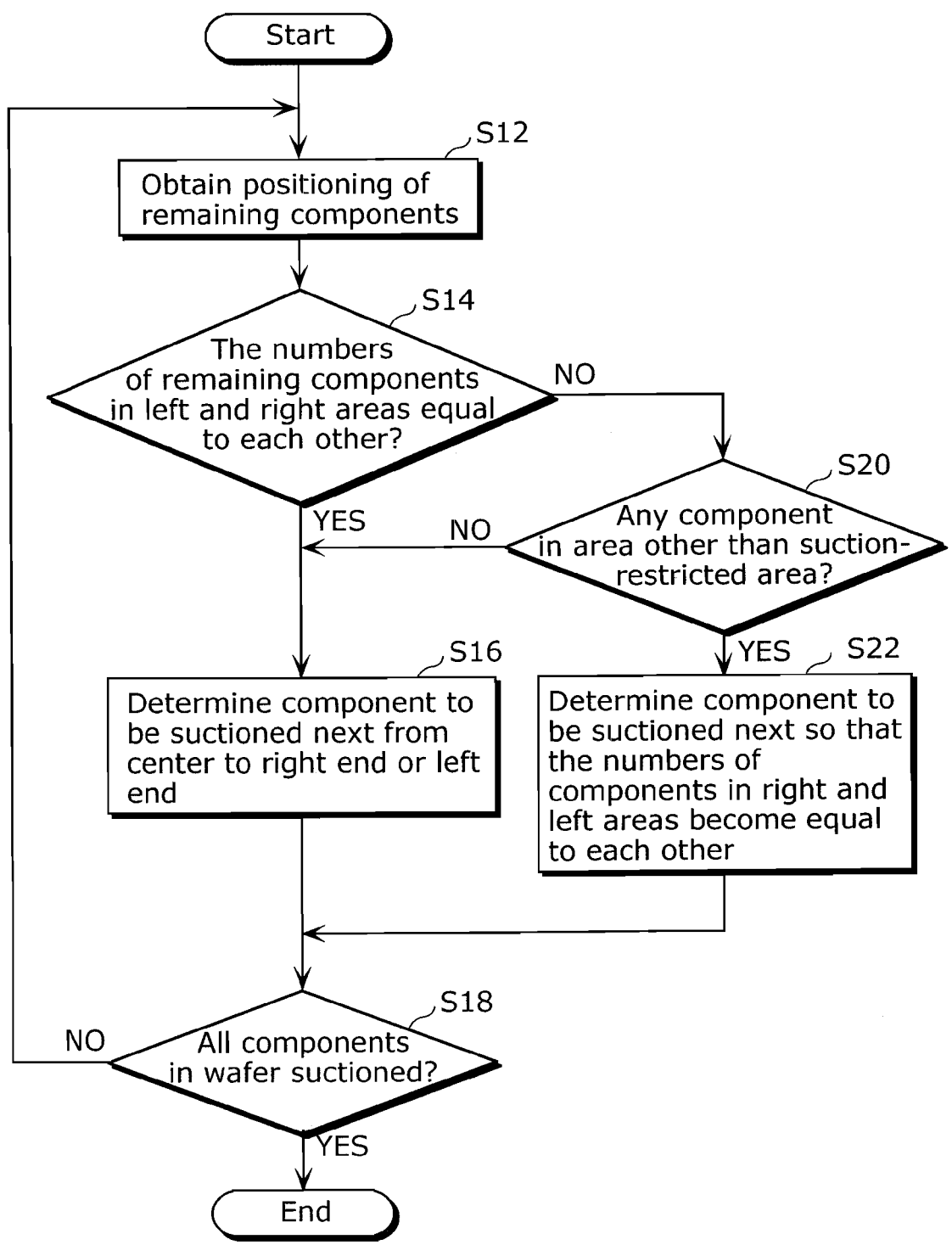
FIG. 22 is a flowchart of a processing executed by the suction order determining device.

FIG. 22 is a flowchart of the processing executed by the suction order determining unit 300.

The remaining component judging unit 303 obtains the arrangement information of the semiconductor chips 2 remaining on the wafer 1 from the wafer information storage unit 302 (S12).

The remaining component judging unit 303 judges whether or not the numbers of the remaining semiconductor chips 2 on the wafer 1 are equal between the right side and left side of the wafer 1 (S14). More specifically, in the case of an unused wafer 1, it is assumed that there is a center line 93 dividing the unused wafer 1 into the right side and the left side so that the numbers of the semiconductor chips become equal between the right and left sides. The remaining component judging unit 303 compares the number of the semiconductor chips 2 which remain in the area 1L located in the left side of the center line 93 with the number of semiconductor chips 2 which remain the area 1R located in the right side of the center line 93, and when the difference between them falls within three, it determines that the numbers of the semiconductor chips 2 are equal between the right and left sides of the wafer 1. When the difference between them is four or more, the remaining component judging unit 303 judges that the numbers of the semiconductor chips 2 are not equal between the right and left sides of the wafer 1. Three semiconductor chips 2 can be suctioned at the same time by the first head unit 4 or the second head unit 34. Thus, when the difference between them is four or more, one of the head units is to suction the semiconductor chips 2 two times in sequence in the end. This is why the latter judgment is made.

When the numbers of the semiconductor chips are equal between the left side and right side of the wafer 1 (YES in S14), the suction order determining unit 301 determines the component to be suctioned by the first head unit 4 or the second head unit 34 according to the same suction order as the one described in the second embodiment (S16). In other words, the components are sequentially suctioned in the left side or the right side from the center line 93 of the wafer 1. The first head unit 4 or the second head unit 34 suctions the component determined by the suction order determining unit 301.

Figure 23:
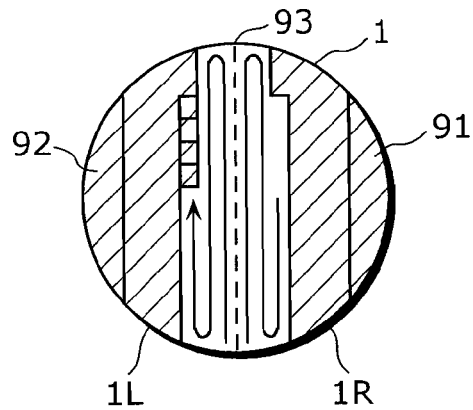
FIG. 23 is a diagram showing an example of a wafer where the numbers of remaining semiconductor chips in the right and left areas are not equal to each other.

When the numbers of the semiconductor chips are not equal between the left side and right side of the wafer 1 (NO in S14), the remaining component judging unit 303 judges whether there is any component in an area other than the suction-restricted areas (S20). When there are remaining components in the suction restricted area 91 or the suction restricted area 92 (YES in S20), the suction order determining unit 301 determines the component to be suctioned next so that the difference between the numbers of the semiconductor chips 2 in the areas 1L and 1R which are respectively located in the left and right sides of the center line 93 shown in FIG. 23 falls within three (S22). It is assumed, as shown in FIG. 23 for example, that the number of the remaining semiconductor chips 2 in the left-side area 1L is greater by 4 than the number of the remaining semiconductor chips 2 in the right-side area 1R and that the next component is to be suctioned by the second head unit 34. In this case, the suction order determining unit 301 determines the component to be suctioned next by the second head unit 34 by selecting it from among the semiconductor chips 2 in the left-side area 1L. The second head unit 34 suctions components in the left-side area 1L according to the determination.

In the case where all the remaining components remain in a suction-restricted area (NO in S20), the head unit which can suction the components is predetermined. Therefore, the suction order determining unit 301 executes the processing of S16, and the first head unit 4 or the second head unit 34 suction the components determined in the processing of S16 in the suction-restricted area.

After the first head unit 4 or the second head unit 34 completes suction operations, the suction order determining unit 301 judges whether or not all the components are suctioned in the in-process wafer 1 (S18).

In the case where all the components have been suctioned (YES in S18), processing of the wafer 1 is completed.

In the case where all the components have not been suctioned (NO in S18), the suction order determining unit 301 and the remaining component judging unit 303 repeat the processing of S12 and the subsequent processings until all the components are suctioned.

Figure 24:
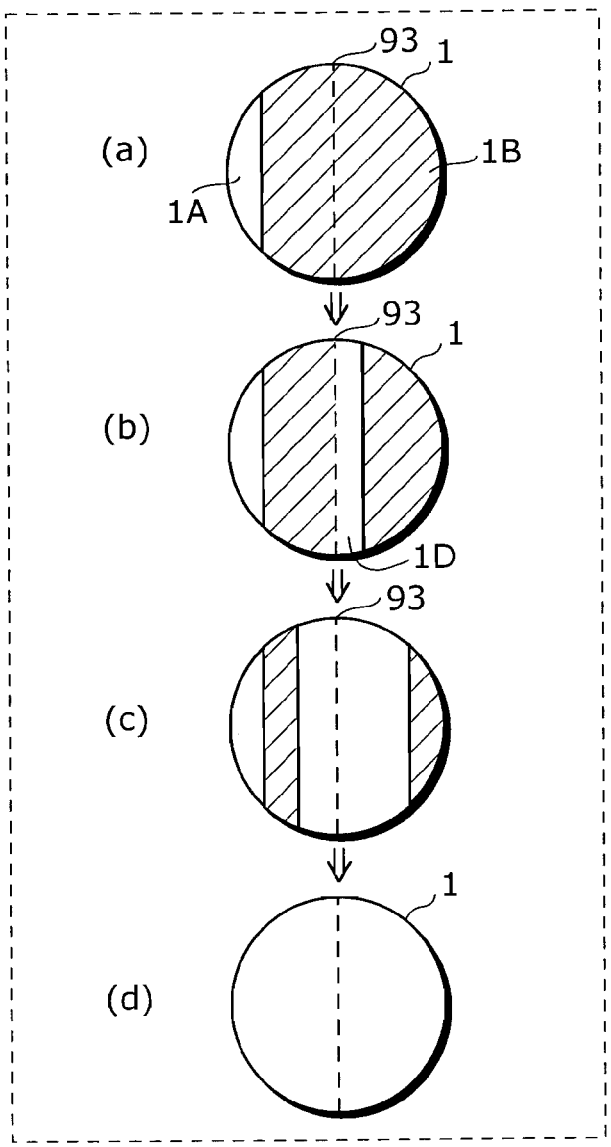
FIG. 24 is a diagram showing the process of suctioning semiconductor chips on a wafer according to a determined suction order.

The next case to be considered is the case of suctioning semiconductor chips 2 from an in-process wafer 1 as shown in FIG. 17. FIG. 24 is a diagram showing the process of suctioning the semiconductor chips 2 on the wafer 1 according to the determined component suction order. The shaded parts in the figure show the areas 1B where semiconductor chips 2 remain. The unshaded parts show the areas 1A where no semiconductor chips 2 remain. Here, the areas 1A are located in the left sides of the wafer 1.

In the initial state shown in FIG. 24(a), the number of remaining semiconductor chips 2 is greater in the right-side area from the center line 93. Therefore, the suction order determining unit 301 determines a component suction order according to which the first head unit 4 and second head unit 34 suction components in the right-side area. FIG. 24(b) shows the state where components are suctioned according to the suction order and the numbers of the semiconductor chips 2 in the respective areas located left and right from the center line 93 become equal to each other. In other words, the side left to the center line 93 remains in the initial state, but in the side right to the center line 93, semiconductor chips 2 in the area 1D around the center line 93 have been suctioned. Subsequently, as shown in FIG. 24(c), the number of remaining semiconductor chips 2 decreases under the state where the numbers of remaining semiconductor chips 2 in the right and left sides are equal. Lastly, as shown in FIG. 24(d), all the semiconductor chips 2 on the wafer 1 are suctioned.

As described up to this point, according to the third embodiment, the suction order of semiconductor chips are determined monitoring whether or not the numbers of remaining semiconductor chips in the right and left areas are equal, and the first head unit 4 and the second head unit 34 suction the components. This enables the first head unit 4 and second head unit 34 to alternately suction the semiconductor chips 2 of a wafer 1 throughout the suction operations; that is, this enables the first head unit 4 and second head unit 34 to execute cooperated operations. This eliminates the possibility that semiconductor chips 2 are mounted onto circuit boards 8 using one of the head units only and pausing the other head unit. Thus, these two head units can mount the semiconductor chips 2 executing cooperated operations. Therefore, it is possible to improve the efficiency in manufacturing circuit boards 8.

Fourth Embodiment

A fourth embodiment will be described below. It is assumed in the first to third embodiments that the component mounting apparatus suctions semiconductor chips 2 from a wafer 1. However, in the fourth embodiment, the component mounting apparatus suctions components housed in a tray and mounts them onto circuit boards which are an example of boards.

The schematic structure and operations of the component mounting apparatus are the same as the ones described in the first embodiment. Therefore, detailed descriptions regarding the structure and operations are not repeated. The component mounting apparatus according to the fourth embodiment suctions components from a tray instead of a wafer 1 and mounts them onto circuit boards.

Figure 25:
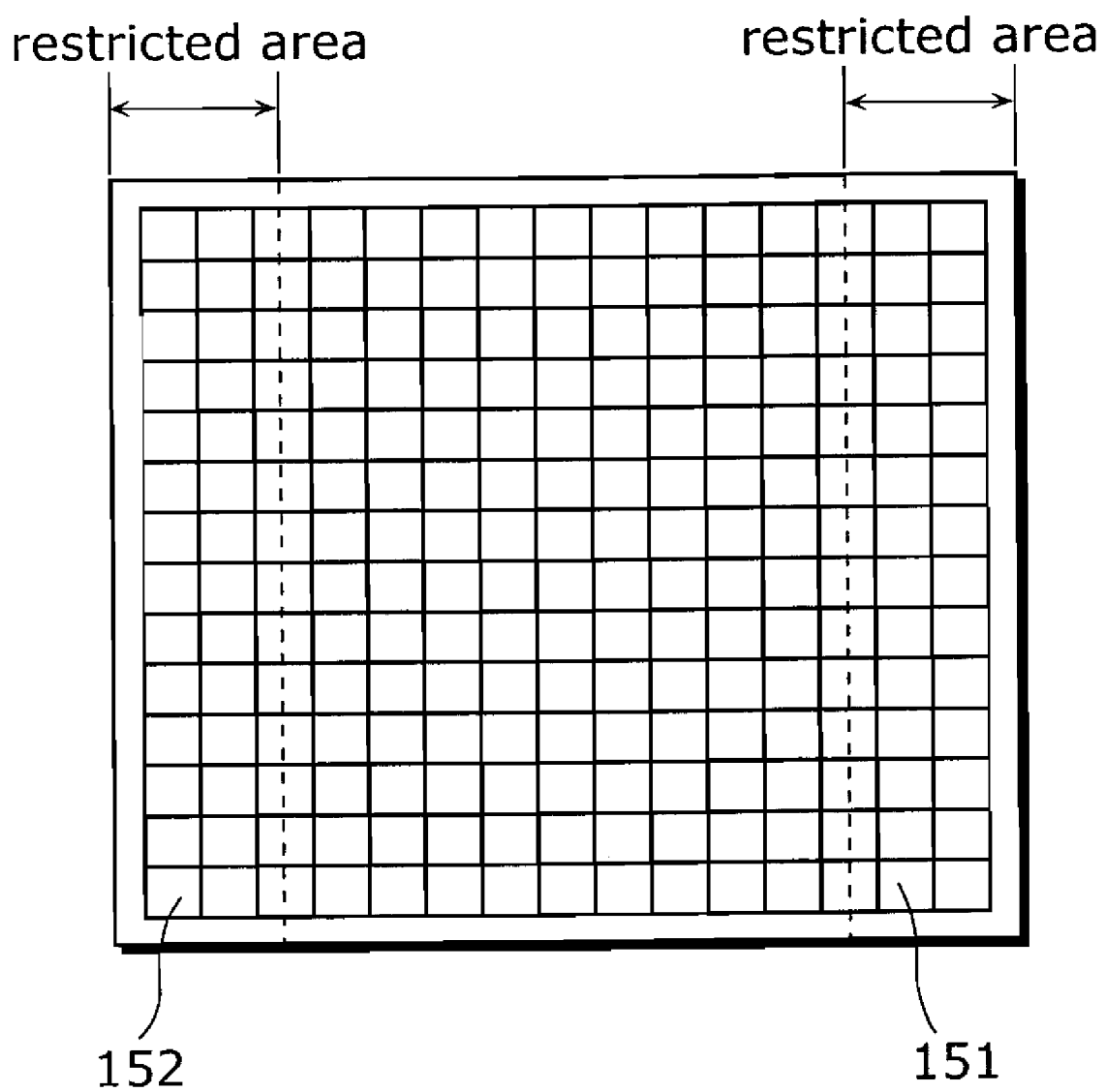
FIG. 25 is a diagram showing an example of a tray.

FIG. 25 is a diagram showing an example of a tray. As shown in the figure, the tray is divided into a lattice of cells and each cell houses a component.

Likewise the case of the wafer 1, when the tray moves to a left-side mounting stage 109, it is natural that a second head unit 34 cannot suction components from the tray, and additionally, a suction-restricted area 151 where even a first head unit 4 cannot suction components may be generated. Likewise, a suction-restricted area 152 where even the second head unit 34 in addition to the first head unit 4 cannot suction components is generated when the tray moves to a right-side mounting stage 110 in the figure.

Therefore, the suction order determining apparatus shown in any of the first to third embodiments determines the suction order so that these two mounting heads suction components according to the same suction order in the case of using the wafer 1 even in this case of using a tray.

Note that the component mounting apparatus may suction components from a component supplying unit where component cassettes housing components are arranged in the X-axis direction. In the case of using such a component supplying unit that has a long length in the X-axis direction, suction-restricted areas are generated in the right and left areas of the component supplying unit likewise the case of using the wafer 1. In other words, components cassettes from which only one of the head units can suction components are generated. Even in this case, the suction order determining apparatus may determine the suction order so that these two mounting heads suction components according to the same suction order as the case of using the wafer 1.

According to the fourth embodiment, even in the case of picking up components from the tray having suction-restricted areas or the arranged component cassettes, components are suctioned according to the same suction order as those in the first to third embodiments. This enables the first head unit 4 and the second head unit 34 to alternately suction components when mounting the components onto boards; that is, this enables the first head unit 4 and second head unit 34 to execute cooperated operations. This eliminates the possibility that components are mounted onto circuit boards 8 using one of the head units only and pausing the other head unit. Thus, these two head units can mount the components executing cooperated operations. Therefore, it is possible to improve the efficiency in manufacturing circuit boards 8.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The present invention is applicable to a component suction order determining apparatus in a component mounting apparatus which mounts components onto circuit boards. The present invention is particularly applicable to a component suction order determining apparatus in a component mounting apparatus which has plural mounting heads.

The invention claimed is:

1. A component pickup order determining method for a component mounting apparatus which causes a plurality of mounting heads to pick up components from a component supplying unit while sliding the component supplying unit and to mount the components onto boards,
    wherein the component supplying unit includes at least one restricted area where only one of the mounting heads can pick up components, and
    said component pickup order determining method comprises a component pickup order determining step of determining a component pickup order according to which the plurality of mounting heads pick up components from the component supplying unit so that components corresponding to two or more tasks do not remain in only a restricted area among at least one restricted area, the tasks being the mounting of at least one component by one of the mounting heads in one iteration of a sequence of operations which are suctioning, moving and mounting of a component.

2. The component pickup order determining method according to claim 1,
    wherein in said component pickup order determining step, the component pickup order according to which the plurality of mounting heads pick up components from the component supplying unit is determined so that components included in the restricted area are picked up first, and then components included in an area other than the restricted area are picked up.

3. The component pickup order determining method according to claim 2,
    wherein the plurality of mounting heads include a first mounting head and a second mounting head,
    the component supplying unit has: a first restricted area where the second mounting head can pick up components but the first mounting head cannot pick up components; and a second restricted area where the first mounting head can pick up components but the second mounting head cannot pick up components, and
    said component pickup order determining step includes:
    a first component pickup order determining step of determining a component pickup order according to which the first mounting head picks up components from the component supplying unit so that components included in the second restricted area are picked up first, and then components included in an area other than the second restricted area are picked up; and
    a second component pickup order determining step of determining a component pickup order according to which the second mounting head picks up components from the component supplying unit so that components included in the first restricted area are picked up first, and then components included in an area other than the first restricted area are picked up.

4. The component pickup order determining method according to claim 3,
wherein the respective first restricted area and second restricted area are areas including an edge of the component supplying unit,
in said first component pickup order determining step, the component pickup order according to which the first mounting head picks up components from the component supplying unit is determined so that components are sequentially picked up in a direction from the second restricted area to a center of the component supplying unit, and
in said second component pickup order determining step, the component pickup order according to which the second mounting head picks up components from the component supplying unit is determined so that components are sequentially picked up in a direction from the first restricted area to the center of the component supplying unit.

5. The component pickup order determining method according to claim 1,
wherein the plurality of mounting heads include a first mounting head and a second mounting head,
the component supplying unit has: a first restricted area where the second mounting head can pick up components but the first mounting head cannot pick up components; and a second restricted area where the first mounting head can pick up components but the second mounting head cannot pick up components,
in said component pickup order determining step, a component pickup order according to which the first mounting head picks up components from the component supplying unit and a component pickup order according to which the second mounting head picks up components from the component supplying unit are determined so as to maintain a state where the number of remaining components in an area where the first mounting head picks up components and the number of remaining components in an area where the second mounting head picks up components are approximately equal to each other.

6. The component pickup order determining method according to claim 5,
wherein said component pickup order determining step includes:
a judging step of judging whether or not the number of remaining components in the area where the first mounting head picks up components and the number of remaining components in the area where the second mounting head picks up components are approximately equal to each other; and
a determining step of determining component pickup order for preferentially picking up components included in one of the areas with a greater number of remaining components, when it is judged in said judging step that the numbers are not approximately equal to each other.

7. A component pickup order determining apparatus which causes a plurality of mounting heads to pick up components from a component supplying unit while sliding said component supplying unit and to mount the components onto boards,
wherein the component supplying unit includes at least one restricted area where only one of the mounting heads can pick up components, and
said component pickup order determining apparatus comprises a component pickup order determining unit operable to determine a component pickup order according to which the plurality of mounting heads pick up components from the component supplying unit so that components corresponding to two or more tasks do not remain in only a restricted area among at least one restricted area, the tasks being the mounting of at least one component by one of said mounting heads in one iteration of a sequence of operations which are suctioning, moving and mounting of a component.

8. A component mounting method for a component mounting apparatus which causes a plurality of mounting heads to pick up components from a component supplying unit while sliding the component supplying unit and to mount the components onto boards,
wherein the component supplying unit includes at least one restricted area where only one of the mounting heads can pick up components, and
said component mounting method comprises a component pickup step in which the plurality of mounting heads pick up components from the component supplying unit so that components corresponding to two or more tasks do not remain in only a restricted area among at least one restricted area, the tasks being the mounting of at least one component by one of the mounting heads in one iteration of a sequence of operations which are suctioning, moving and mounting of a component.

9. A component mounting apparatus which causes a plurality of mounting heads to pick up components from a component supplying unit while sliding said component supplying unit and to mount the components onto boards,
wherein the component supplying unit includes at least one restricted area where only one of the mounting heads can pick up components, and
said component mounting apparatus comprises a component pickup unit which has the plurality of mounting heads for picking up components from said component supplying unit so that components corresponding to two or more tasks do not remain in only a restricted area among at least one restricted area, the tasks being the mounting of at least one component by one of said mounting heads in one iteration of a sequence of operations which are suctioning, moving and mounting of a component.

10. A program, being embodied on a non-transitory computer-readable recording medium, for a component mounting apparatus which causes a plurality of mounting heads to pick up components from a component supplying unit while sliding the component supplying unit and to mount the components onto boards,
wherein the component supplying unit includes at least one restricted area where only one of the mounting heads can pick up components, and
said program causing a computer to execute a method comprising
a component pickup order determining step of determining a component pickup order according to which the plurality of mounting heads pick up components from the component supplying unit so that components corresponding to two or more tasks do not remain in only a restricted area among at least one restricted area, the tasks being the mounting of at least one component by one of the mounting heads in one iteration of a sequence of operations which are suctioning, moving and mounting of a component.

* * * * *